(12) United States Patent  (10) Patent No.: US 8,089,112 B2
Murata et al.  (45) Date of Patent: *Jan. 3, 2012

(54) SEMICONDUCTOR DEVICE AND MANUFACTURING METHOD THEREOF

(75) Inventors: Tatsunori Murata, Tokyo (JP); Mikio Tsujiuchi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/053,695

(22) Filed: Mar. 22, 2011

(65) Prior Publication Data

US 2011/0169113 A1  Jul. 14, 2011

Related U.S. Application Data

(63) Continuation of application No. 12/832,505, filed on Jul. 8, 2010, now Pat. No. 7,939,871, which is a continuation of application No. 12/424,982, filed on Apr. 16, 2009, now Pat. No. 7,772,662.

(30) Foreign Application Priority Data

May 30, 2008  (JP) .................................. 2008-142534

(51) Int. Cl.
 *H01L 21/02* (2006.01)
(52) U.S. Cl. ................ 257/295; 257/421; 257/E29.323; 257/E43.006

(58) Field of Classification Search .................. 257/295, 257/242, E29.323, E34.006, 421
See application file for complete search history.

(56) References Cited

U.S. PATENT DOCUMENTS

| 7,009,266 B2 | 3/2006 | Shi et al. |
| 7,582,923 B2 | 9/2009 | Fukumoto et al. |
| 7,772,662 B2 | 8/2010 | Murata et al. |
| 2009/0209050 A1 | 8/2009 | Wang et al. |
| 2010/0270634 A1* | 10/2010 | Murata et al. .................. 257/421 |

FOREIGN PATENT DOCUMENTS

JP  2007-053315  3/2007

* cited by examiner

*Primary Examiner* — Trung Q Dang
(74) *Attorney, Agent, or Firm* — McDermott Will & Emery LLP

(57) ABSTRACT

The present invention makes it possible to obtain: a semiconductor device capable of forming a highly reliable upper wire without a harmful influence on the properties of the magnetic material for an MTJ device; and the manufacturing method thereof. Plasma treatment is applied with reducible $NH_3$ or $H_2$ as pretreatment. Thereafter, a tensile stress silicon nitride film to impose tensile stress on an MTJ device is formed over a clad layer and over an interlayer dielectric film where the clad layer is not formed. Successively, a compressive stress silicon nitride film to impose compressive stress on the MTJ device is formed over the tensile stress silicon nitride film. The conditions for forming the tensile stress silicon nitride film and the compressive stress silicon nitride film are as follows: a parallel plate type plasma CVD apparatus is used; the RF power is set in the range of 0.03 to 0.4 W/cm²; and the film forming temperature is set in the range of 200° C. to 350° C.

7 Claims, 30 Drawing Sheets

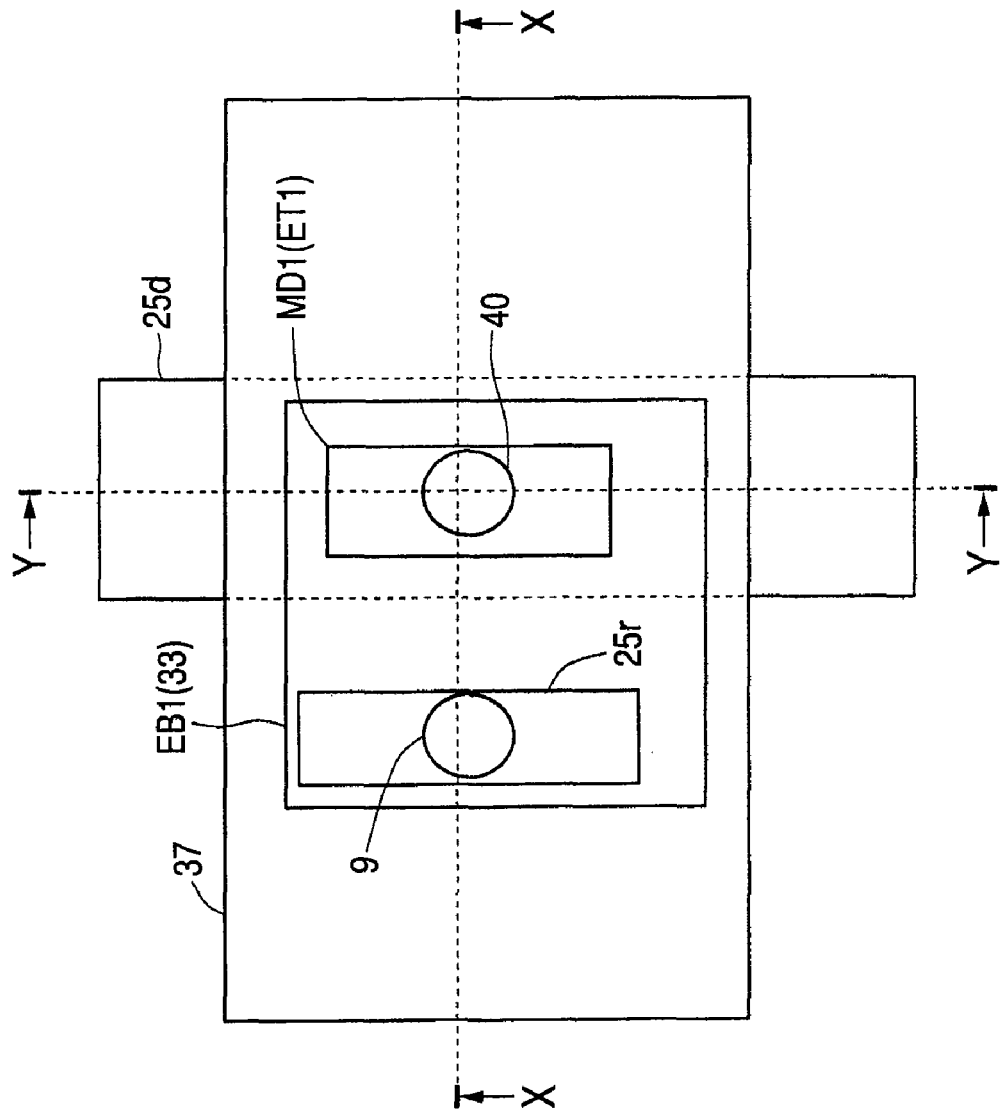

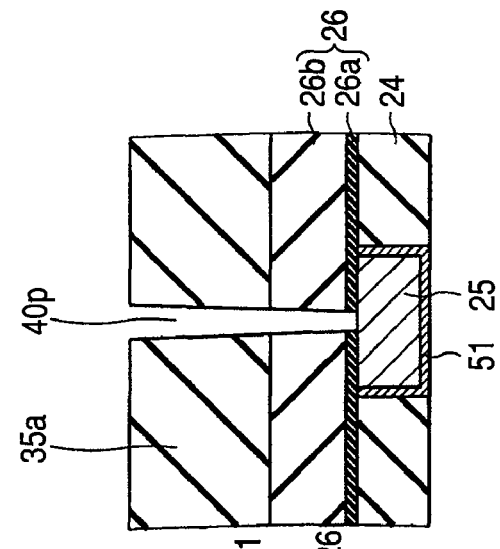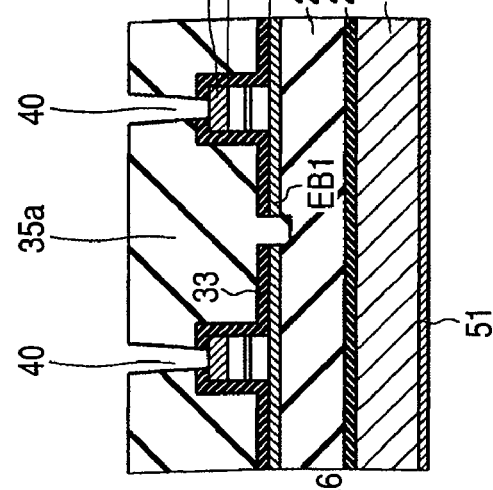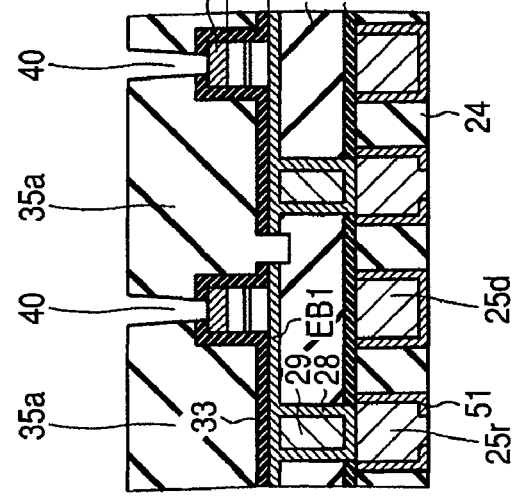

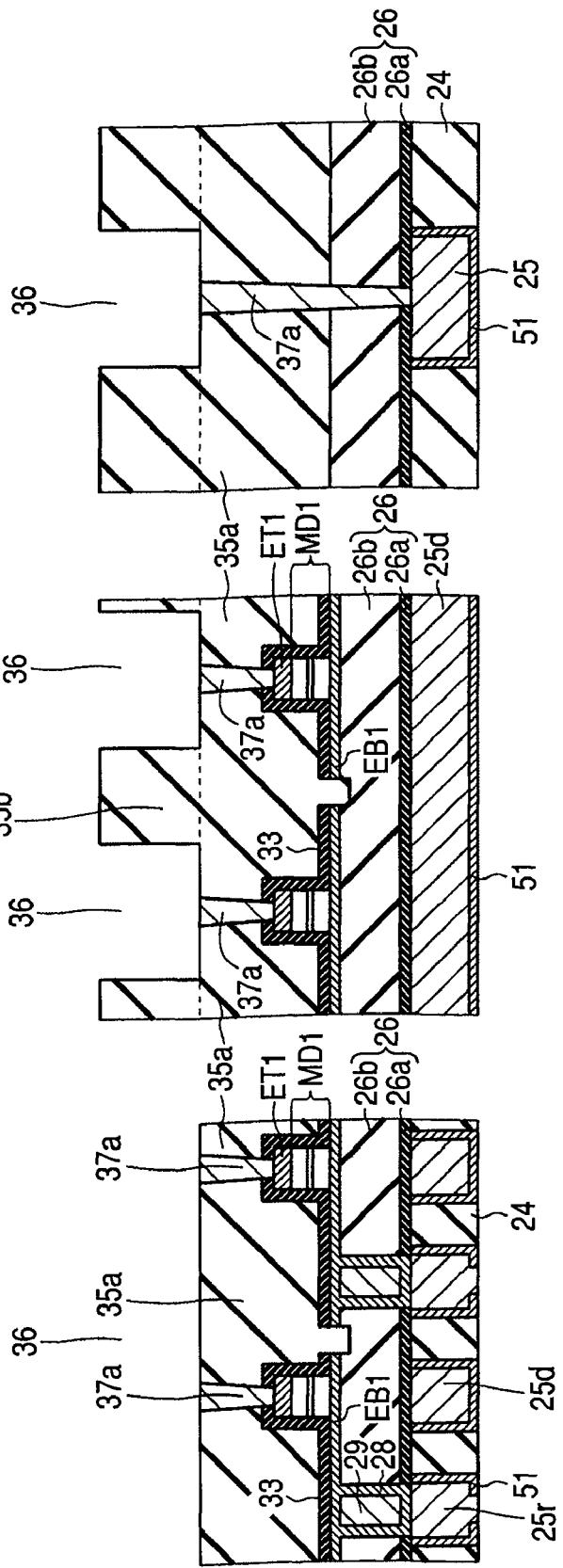

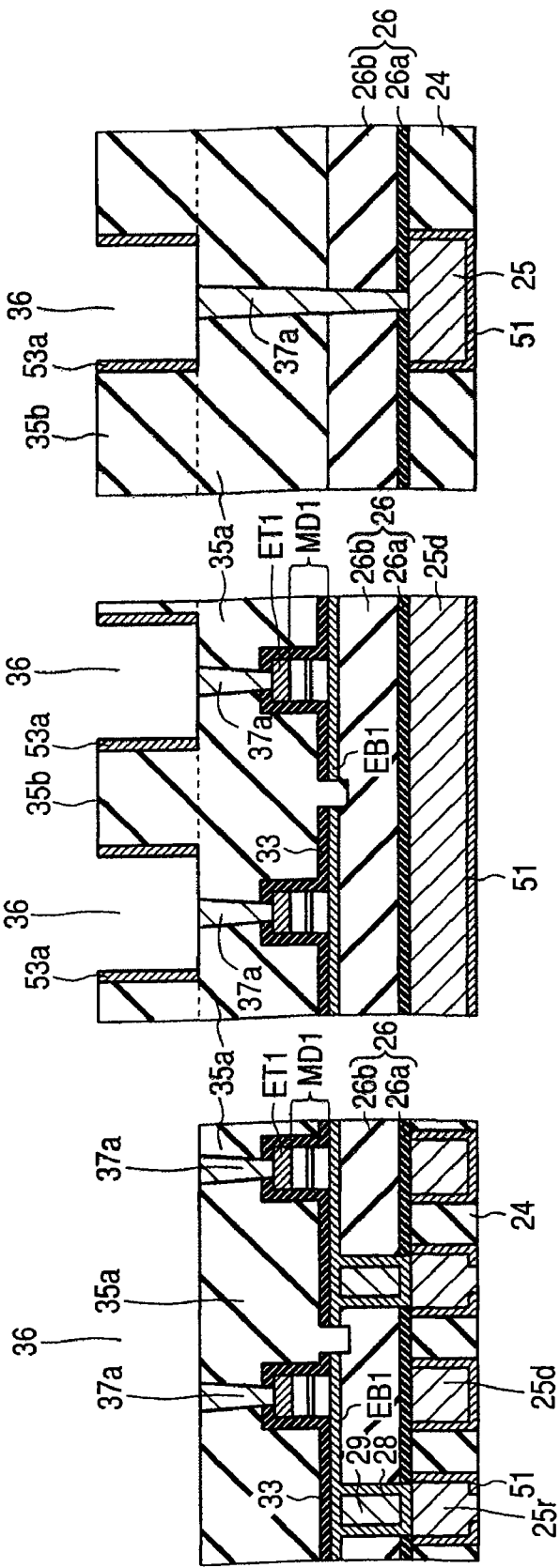

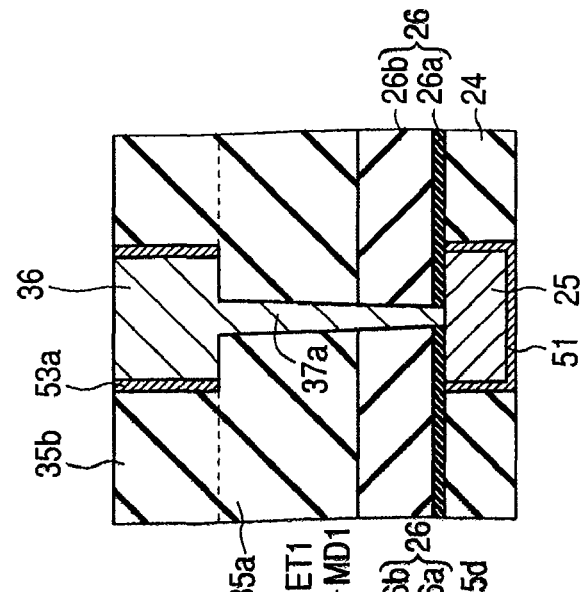
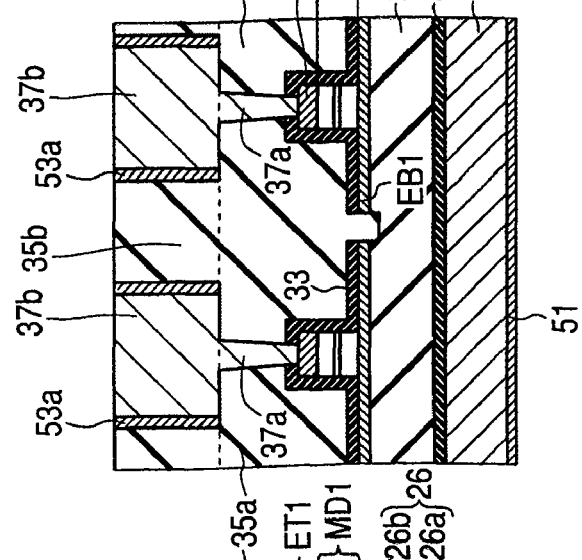
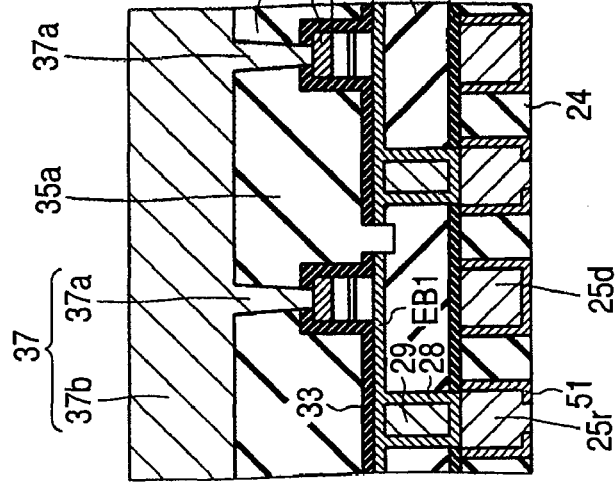
FIG. 27(a)
FIG. 27(b)
FIG. 27(c)

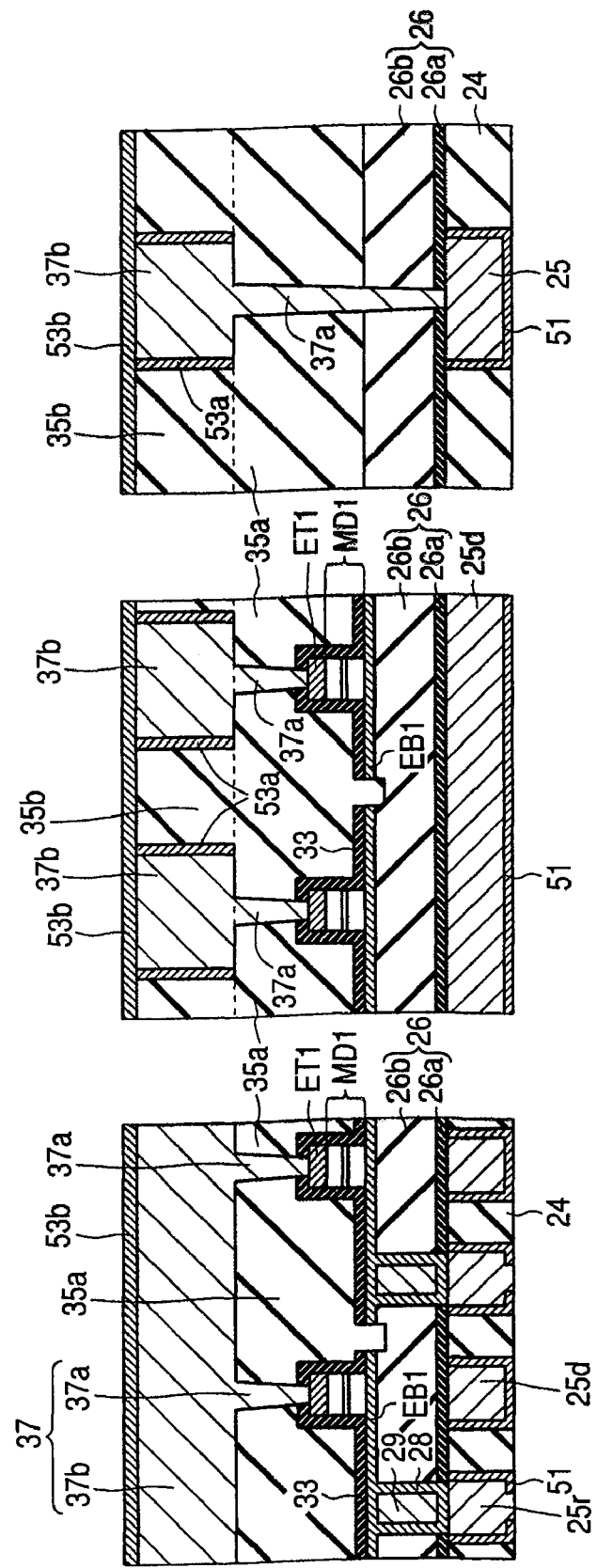

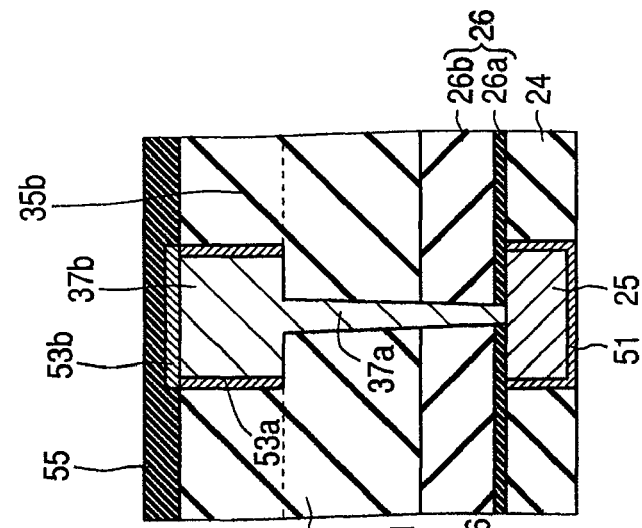
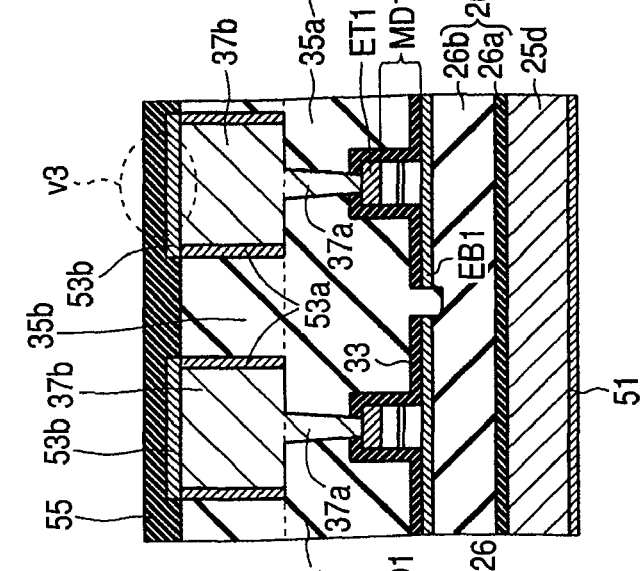
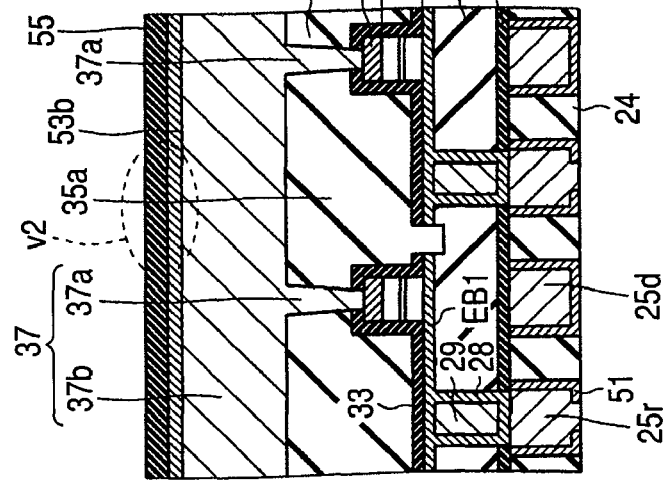

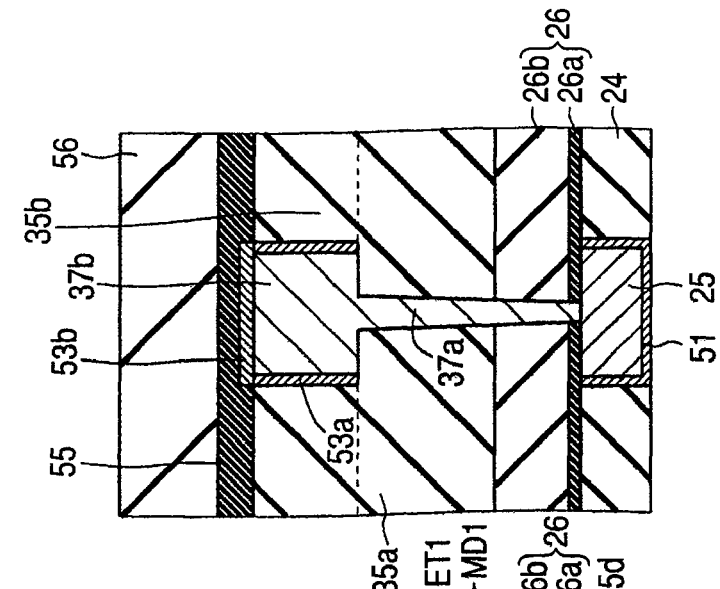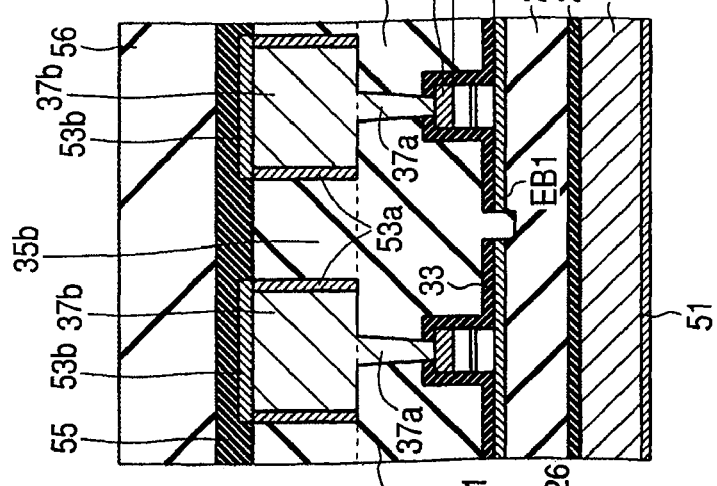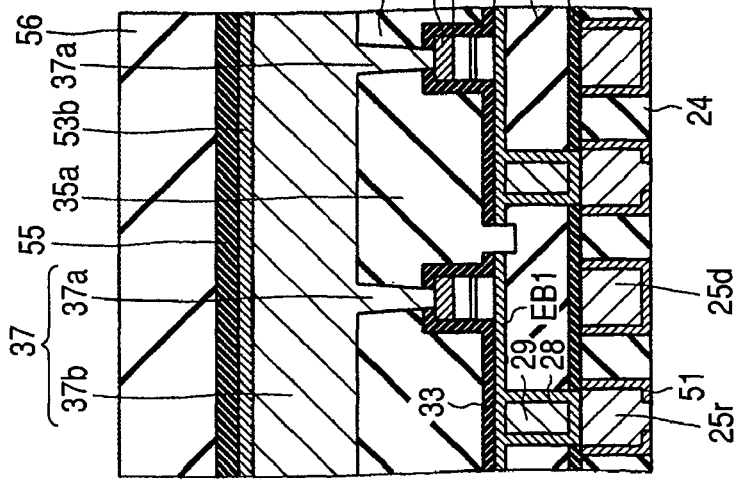

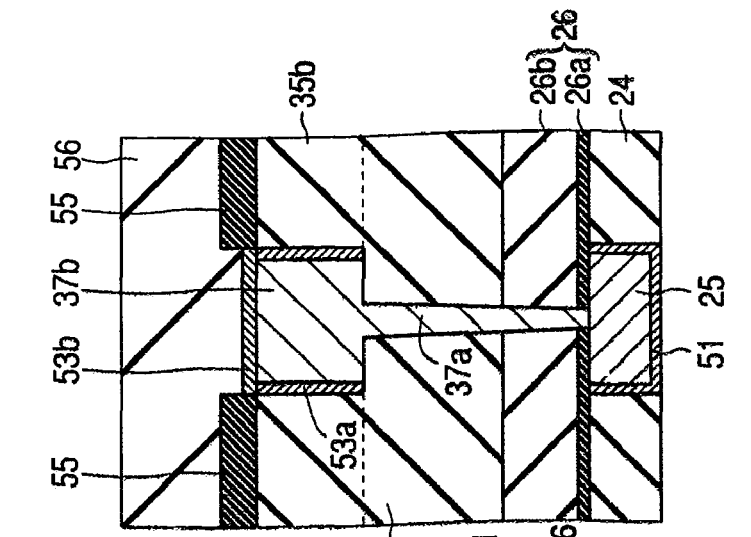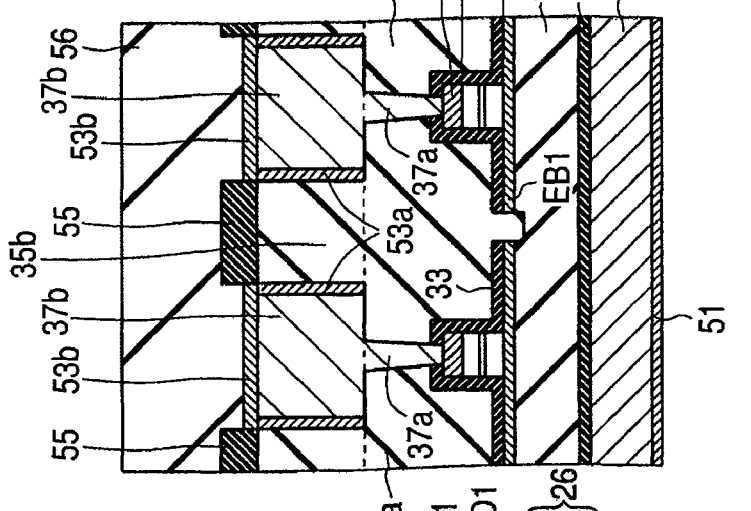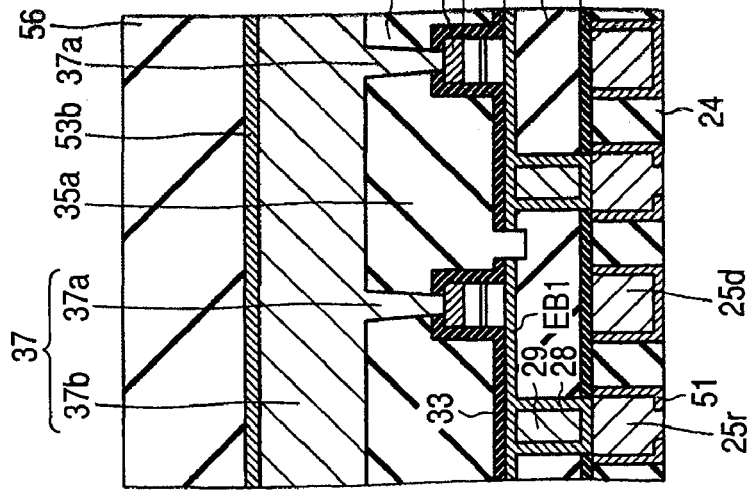

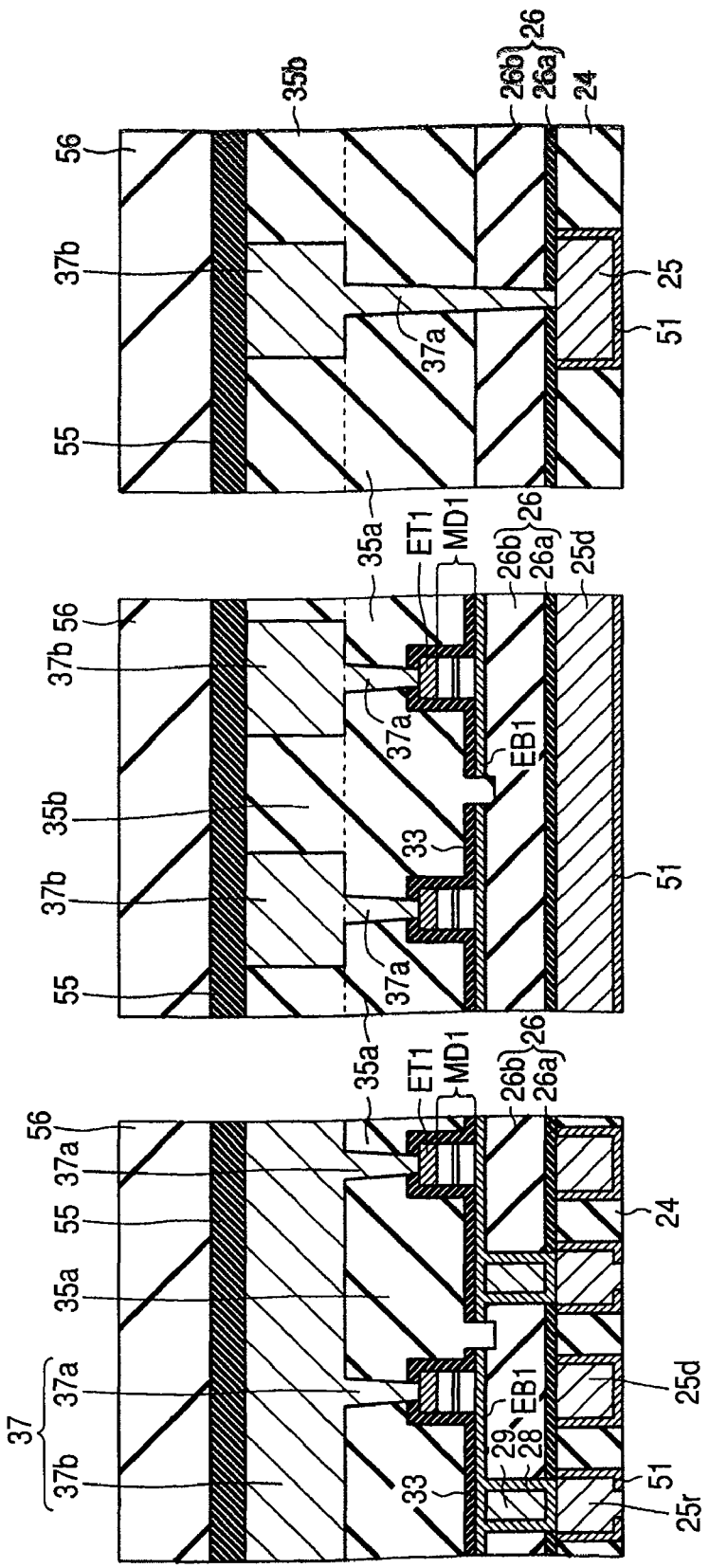

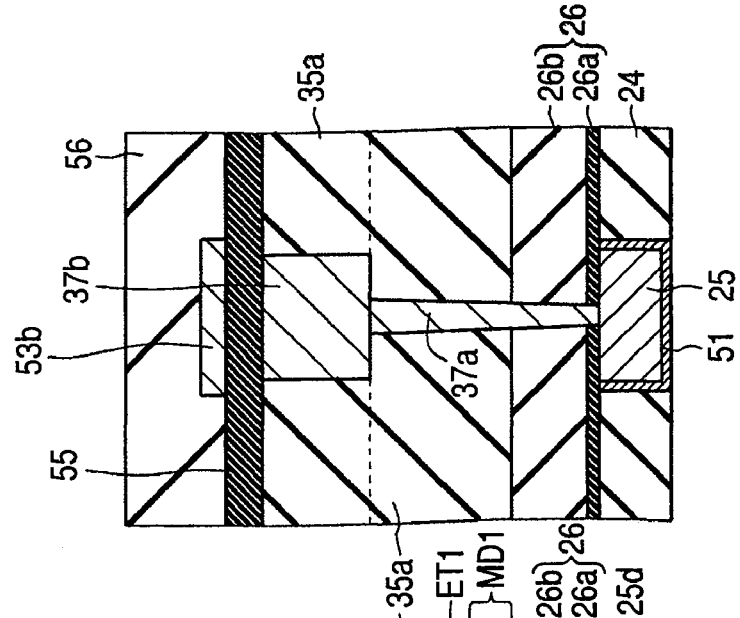
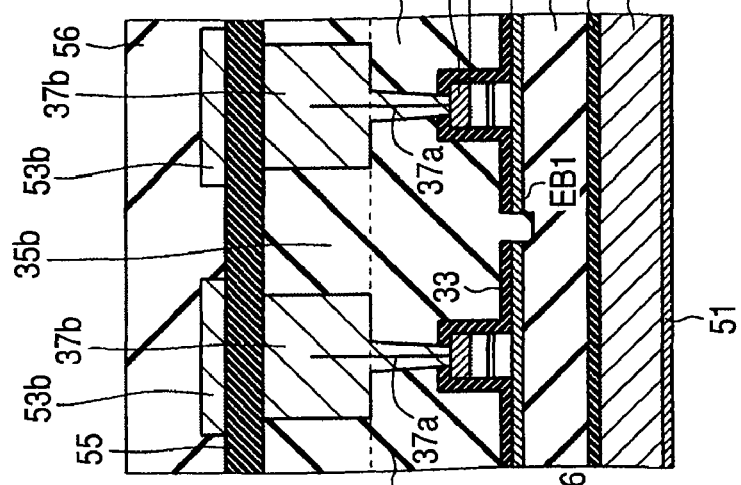
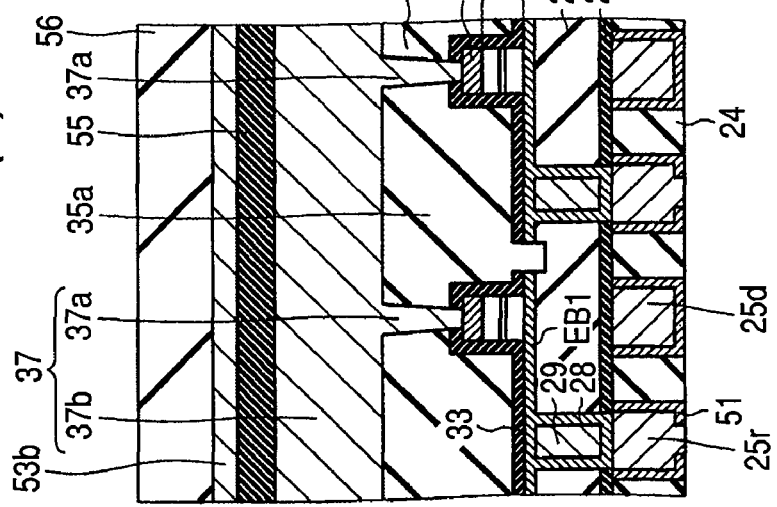

SEMICONDUCTOR DEVICE AND MANUFACTURING METHOD THEREOF

CROSS-REFERENCE TO RELATED APPLICATIONS

This application is a Continuation of U.S. patent application Ser. No. 12/832,505, filed on Jul. 8, 2010 now U.S. Pat. No. 7,939,871, which is a Continuation of U.S. patent application Ser. No. 12/424,982, filed on Apr. 16, 2009, now U.S. Pat. No. 7,772,662 claiming priority of Japanese Patent Application No. 2008-142534, filed on May 30, 2008, the entire contents of each of which are hereby incorporated by reference.

BACKGROUND OF THE INVENTION

The present invention relates to a semiconductor device having a memory device such as an MTJ (Magnetic Tunnel Junction) device, and a method for manufacturing the semiconductor device.

An MRAM is a memory to store data by using a magnetic substance in a memory device and controlling the orientation of the magnetization in the magnetic substance, namely a memory to retain data by storing information in the spin of an electron, and the circuit is structured so as to be randomly accessible. There is an MTJ device as a memory device used in an MRAM. Here, the term "MTJ device" is used in the Specification as a concept including a TMR (Tunneling Magneto Resistance) device.

An MTJ device is generally manufactured so as to be electrically coupled to an upper wire as a conductive layer formed over the MTJ device. An example of the structure having the upper wire and the manufacturing method thereof are the magnetic memory device and the manufacturing method thereof disclosed in Japanese Unexamined Patent Publication No. 2007-53315.

SUMMARY OF THE INVENTION

As stated above, an MRAM uses a magnetic material as a memory device (an MTJ device). The wiring processes after the MTJ device is formed are required to be applied at a low temperature from the viewpoint of the thermal resistance in the magnetic property of the magnetic material. Consequently, it is desired that an upper wire such as a Cu wire is formed in a low temperature process.

It is concerned however that to form a Cu wire (an upper wire) at a low temperature undergoes the influence of the vulnerability or the like in the quality of an interlayer dielectric film formed over the Cu wire similarly at a low temperature and influences the reliability of the upper wire.

The present invention has been established in order to solve the above problems (concerns) and an object of the present invention is to obtain a semiconductor device allowing a highly reliable upper wire to form without rendering a harmful influence to the property of the magnetic material for an MTJ device, and the method for manufacturing the semiconductor device.

In an embodiment according to the present invention, a silicon nitride film that is formed above an MTJ device section and formed over a clad layer configuring an upper wiring section electrically coupled to the MTJ device section is configured by a layered structure comprising a tensile stress silicon nitride film and a compressive stress silicon nitride film.

According to the embodiment, since both the tensile stress silicon nitride film and the compressive stress silicon nitride film can be formed by a manufacturing method of a relatively low power, the property of the magnetic film in an MTJ device section is prevented from being adversely influenced by minimizing damages to the MTJ device section.

In addition, since the compressive stress silicon nitride film has the function of improving the reliability of the upper wiring section, the effect of improving the reliability of the upper wiring section can be exhibited.

BRIEF DESCRIPTION OF THE DRAWINGS

FIG. 21 is a plan view showing a planar structure of a memory cell section including a wiring structure according to the first embodiment.

FIGS. 22(a) to 22(c) are sectional views showing the manufacturing method of an MRAM according to the first embodiment.

FIGS. 24(a) to 24(c) are sectional views showing the manufacturing method of an MRAM according to the first embodiment.

FIGS. 26(a) to 26(c) are sectional views showing the manufacturing method of an MRAM according to the first embodiment.

FIGS. 27(a) to 27(c) are sectional views showing the manufacturing method of an MRAM according to the first embodiment.

FIGS. 28(a) to 28(c) are sectional views showing the manufacturing method of an MRAM according to the first embodiment.

FIGS. 30(a) to 30(c) are sectional views showing the manufacturing method of an MRAM according to the first embodiment.

FIGS. 31(a) to 31(c) are sectional views showing the manufacturing method of an MRAM according to the first embodiment.

FIGS. 34(a) to 34(c) are sectional views showing the structure of an MRAM according to the second embodiment of the present invention.

FIGS. 35(a) to 35(c) are sectional views showing the structure of an MRAM according to the third embodiment of the present invention.

FIGS. 36(a) to 36(c) are sectional views showing a modified example of the structure of an MRAM according to the third embodiment of the present invention.

DETAILED DESCRIPTION OF THE PREFERRED EMBODIMENTS

First Embodiment

Figure 1:
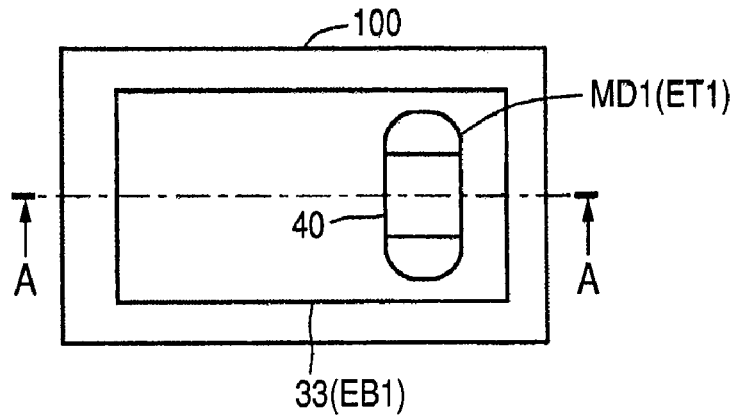
FIG. 1 is a plan view showing a planar structure of an MTJ device section in an MRAM according to the first embodiment of the present invention.

FIG. 1 is a plan view showing a planar structure of a memory cell section (a memory cell forming region) in an MRAM according to the first embodiment of the present invention. As shown in the figure, a lower electrode EB1 having a rectangular shape in a plan view is formed above a semiconductor substrate 100 and an MTJ device MD1 (an upper electrode ET1) having an oblong shape in a plan view is formed on the right side over the lower electrode EB1. Further, a silicon nitride film 33 having a rectangular shape identical to the lower electrode EB1 in a plan view is formed so as to cover the MTJ device MD1. Furthermore, a via hole 40 is formed in the center of the MTJ device MD1.

FIGS. 2 to 20 are sectional views showing the manufacturing method of an MRAM according to the first embodiment. Here, FIGS. 2 to 20 are sectional views taken on line A-A in FIG. 1. FIG. 21 is a plan view showing a planar structure of a memory cell section including a wiring structure according to the first embodiment. FIGS. 22 to 31 are sectional views showing the manufacturing method of an MRAM according to the first embodiment. Here, in each of FIGS. 22 to 31, (a) represents a sectional view taken on line X-X in FIG. 21, (b) represents a sectional view taken on line Y-Y in FIG. 21, and (c) represents a cross-sectional structure at a periphery circuit section different from a memory cell section. A method for manufacturing an MRAM according to the first embodiment is hereunder explained in reference to FIGS. 2 to 31.

Figure 2:
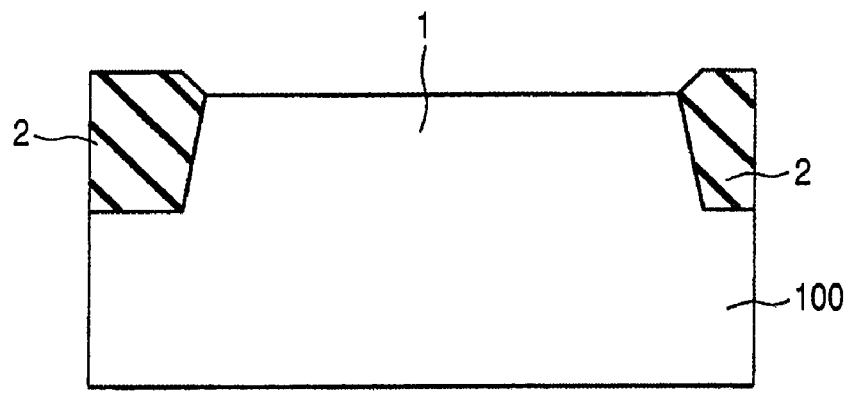
FIG. 2 is a sectional view showing the manufacturing method of an MRAM according to the first embodiment.

Firstly as shown in FIG. 2, device isolation regions 2 are selectively formed at the upper layer part of a semiconductor substrate 100. The upper layer part of the semiconductor substrate 100 between the device isolation regions 2, 2 acts as an active region 1 in which a transistor and others are formed.

Figure 3:
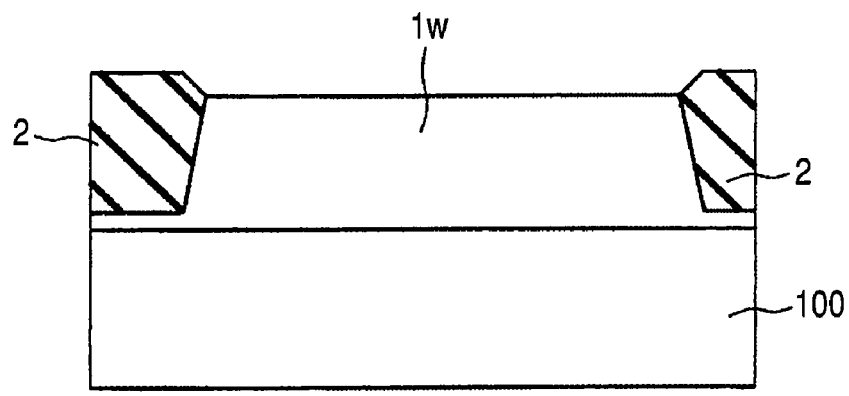
FIG. 3 is a sectional view showing the manufacturing method of an MRAM according to the first embodiment.

Then as shown in FIG. 3, by introducing a first conductive type impurity, a well region 1w is formed at the upper layer part of the semiconductor substrate 100.

Figure 4:
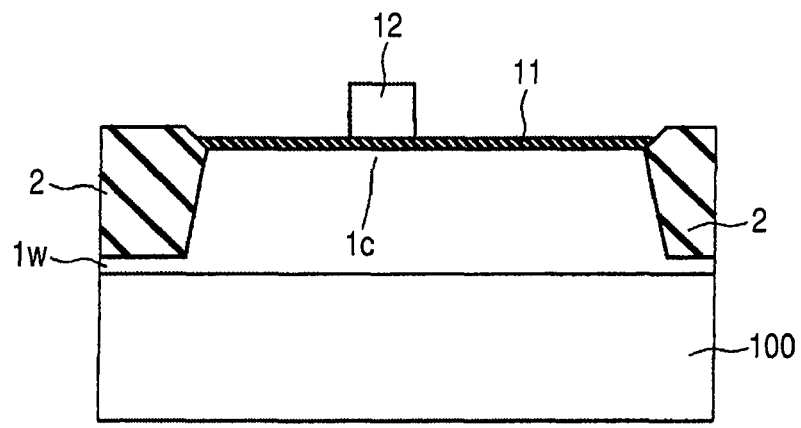
FIG. 4 is a sectional view showing the manufacturing method of an MRAM according to the first embodiment.

Successively as shown in FIG. 4, a gate dielectric film 11 is formed over the well region 1w and a gate electrode 12 is selectively formed over the gate dielectric film 11. The surface of the well region 1w under the gate electrode 12 is defined as a channel region 1c.

Figure 5:
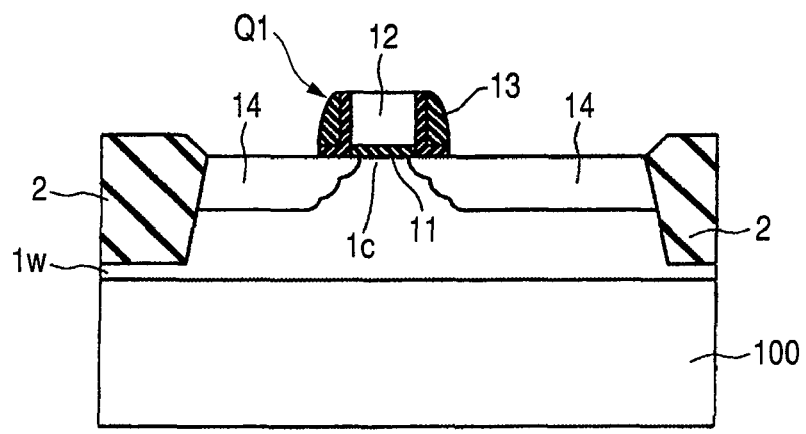
FIG. 5 is a sectional view showing the manufacturing method of an MRAM according to the first embodiment.

Subsequently as shown in FIG. 5, a second conductive type (an opposite conductive type from the first conductive type) impurity is injected and diffused into the gate electrode 12 in a self-aligned manner and thereafter a sidewall 13 of a double layered structure is formed over the side face of the gate electrode 12. Thereafter, a pair of source/drain regions 14, 14 having extension regions in the vicinity of the channel region 1c is formed by injecting and diffusing the second conductive type impurity into the gate electrode 12 and the sidewall 13 in a self-aligned manner. As a result, a MOS transistor Q1 comprising the channel region 1c, the gate dielectric film 11, the gate electrode 12, and the source/drain regions 14 is formed.

Figure 6:
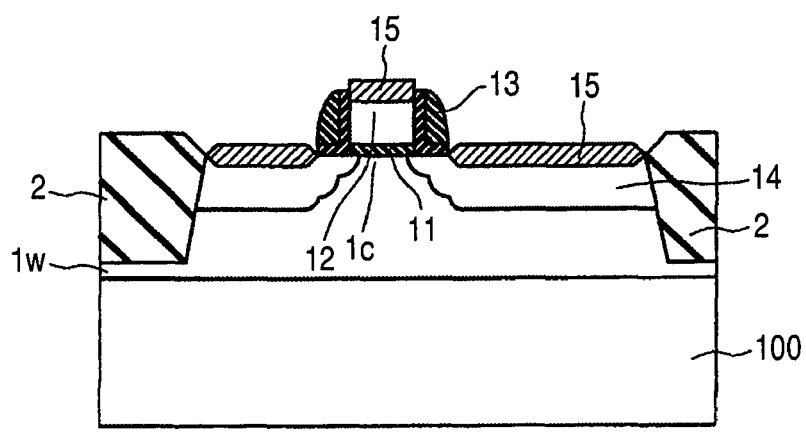
FIG. 6 is a sectional view showing the manufacturing method of an MRAM according to the first embodiment.

Successively as shown in FIG. 6, a silicide region 15 of CoSi or NiSi for example is formed on the surface of each of the source/drain regions 14, 14 and the gate electrode 12.

Figure 7:
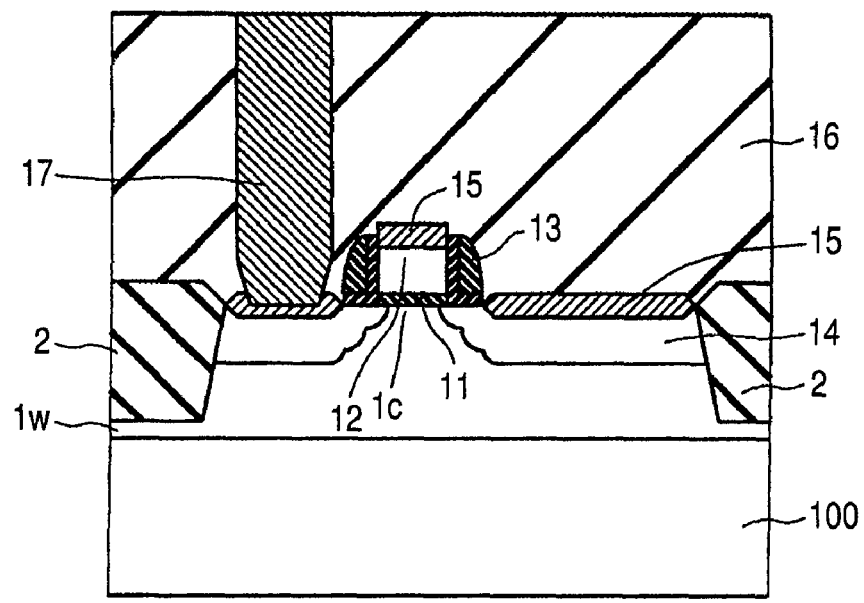
FIG. 7 is a sectional view showing the manufacturing method of an MRAM according to the first embodiment.

Subsequently as shown in FIG. 7, an interlayer dielectric film 16 is formed over the whole surface and a contact plug 17 is selectively formed in the manner of penetrating through the interlayer dielectric film 16. The contact plug 17 is electrically coupled to the silicide region 15 in one of the paired source/drain regions 14, 14.

Figure 8:
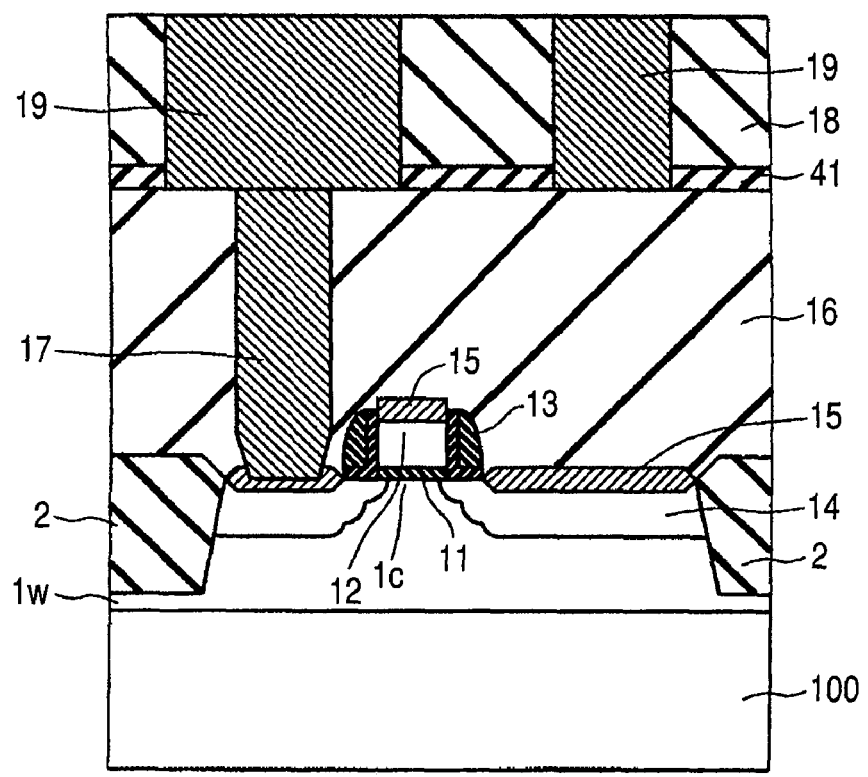
FIG. 8 is a sectional view showing the manufacturing method of an MRAM according to the first embodiment.

Further as shown in FIG. 8, a nitride film 41 and an interlayer dielectric film 18 (as an oxide film) are layered over the whole surface and a Cu wire 19 is selectively formed in the manner of penetrating through the nitride film 41 and the interlayer dielectric film 18. As a result, a part of the Cu wire 19 is electrically coupled to the contact plug 17. In this way, the Cu wire 19 is formed as a first layered metal wire.

Figure 9:
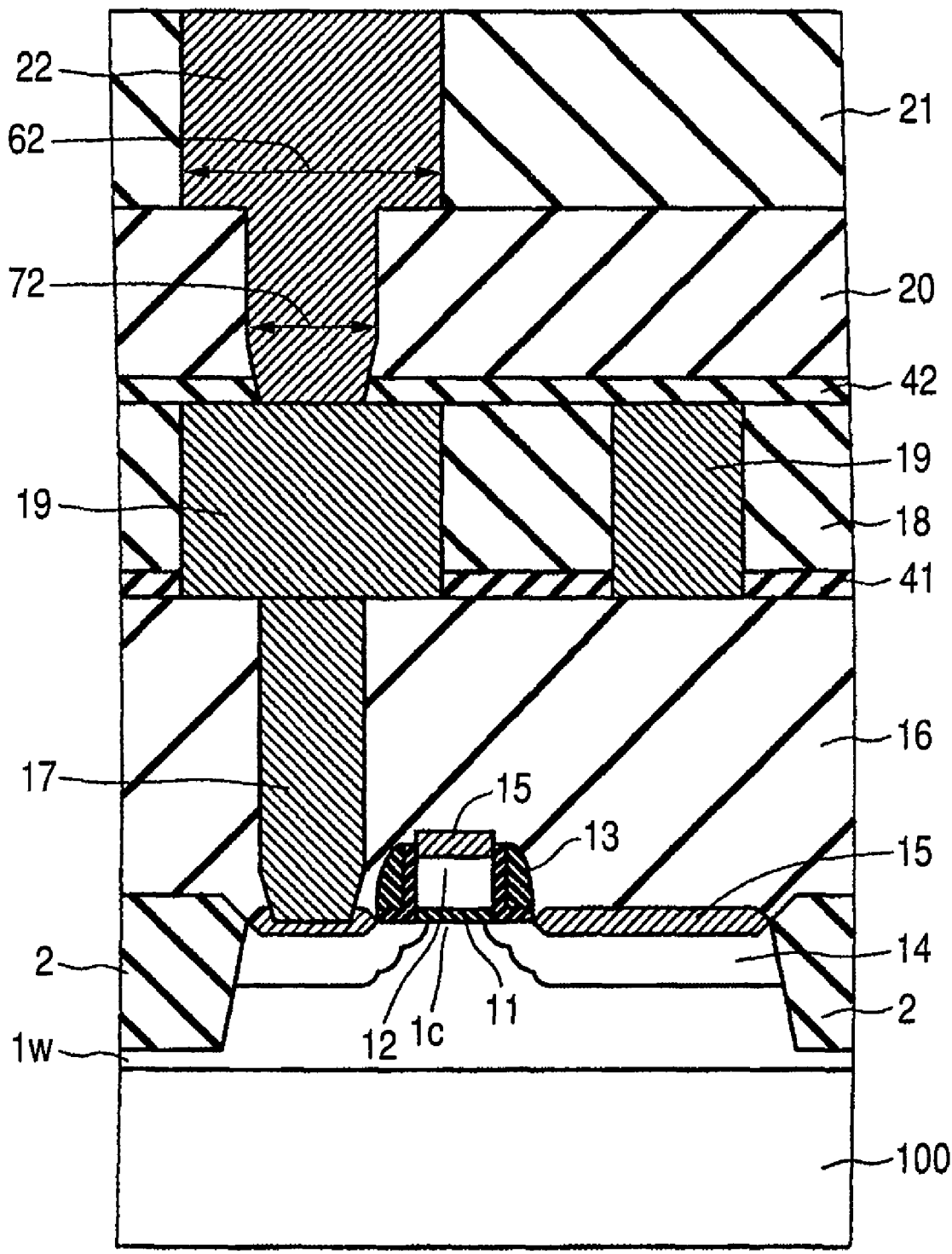
FIG. 9 is a sectional view showing the manufacturing method of an MRAM according to the first embodiment.

Subsequently as shown in FIG. 9, a nitride film 42 and interlayer dielectric films 20 and 21 (as oxide films) are layered over the whole surface and a fine hole 72 is selectively formed in the manner of penetrating through the nitride film 42 and the interlayer dielectric film 20. Further, a wiring hole 62 is selectively formed in the manner of penetrating through the interlayer dielectric film 21 in the region including the fine hole 72 and thereafter a Cu wire 22 is formed by being embedded in the fine hole 72 and the wiring hole 62. The Cu wire 22 is electrically coupled to the Cu wire 19 (the Cu wire 19 electrically coupled to the contact plug 17). In this way, the Cu wire 22 is formed as a second layered metal wire by the damascene technology.

Figure 10:
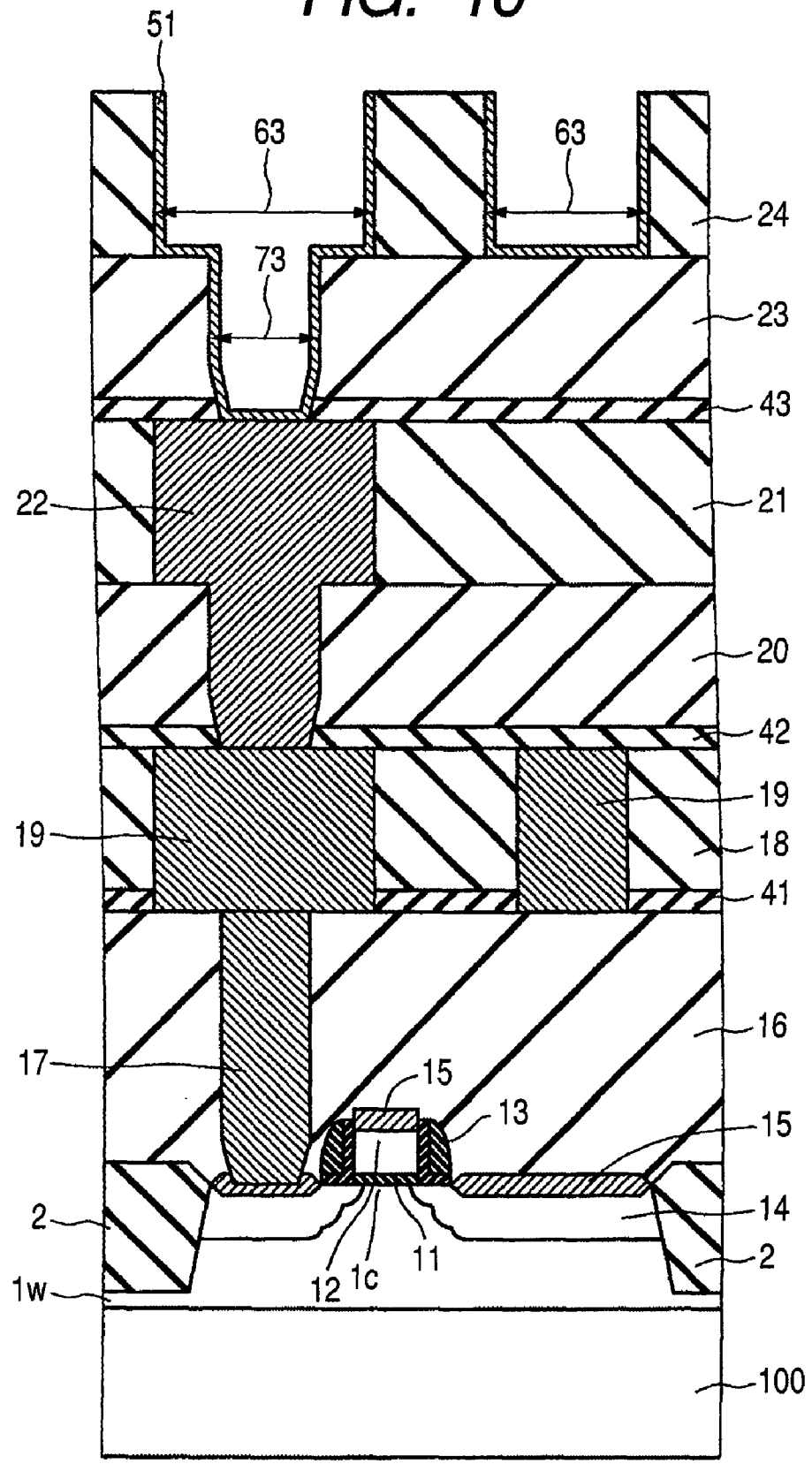
FIG. 10 is a sectional view showing the manufacturing method of an MRAM according to the first embodiment.

Thereafter as shown in FIG. 10, a nitride film 43 and interlayer dielectric films 23 and 24 (comprising oxide films) are formed over the whole surface and a fine hole 73 is selectively formed in the manner of penetrating through the nitride film 43 and the interlayer dielectric film 23. Further, a wiring hole 63 is selectively formed in the manner of penetrating through the interlayer dielectric film 24 in the region including the fine hole 73. Thereafter, a clad layer 51 for magnetic shield is formed over the side faces and the bottom faces of the wiring hole 63 and the fine hole 73 by the sputtering method. As the constituent material of the clad layer 51, a material having a small coercive force and a small residual magnetization but having a magnetic property linear to a magnetic field (cobalt, iron, nickel, etc. or a chemical compound thereof (for example NiFe)) is desirable.

Figure 11:
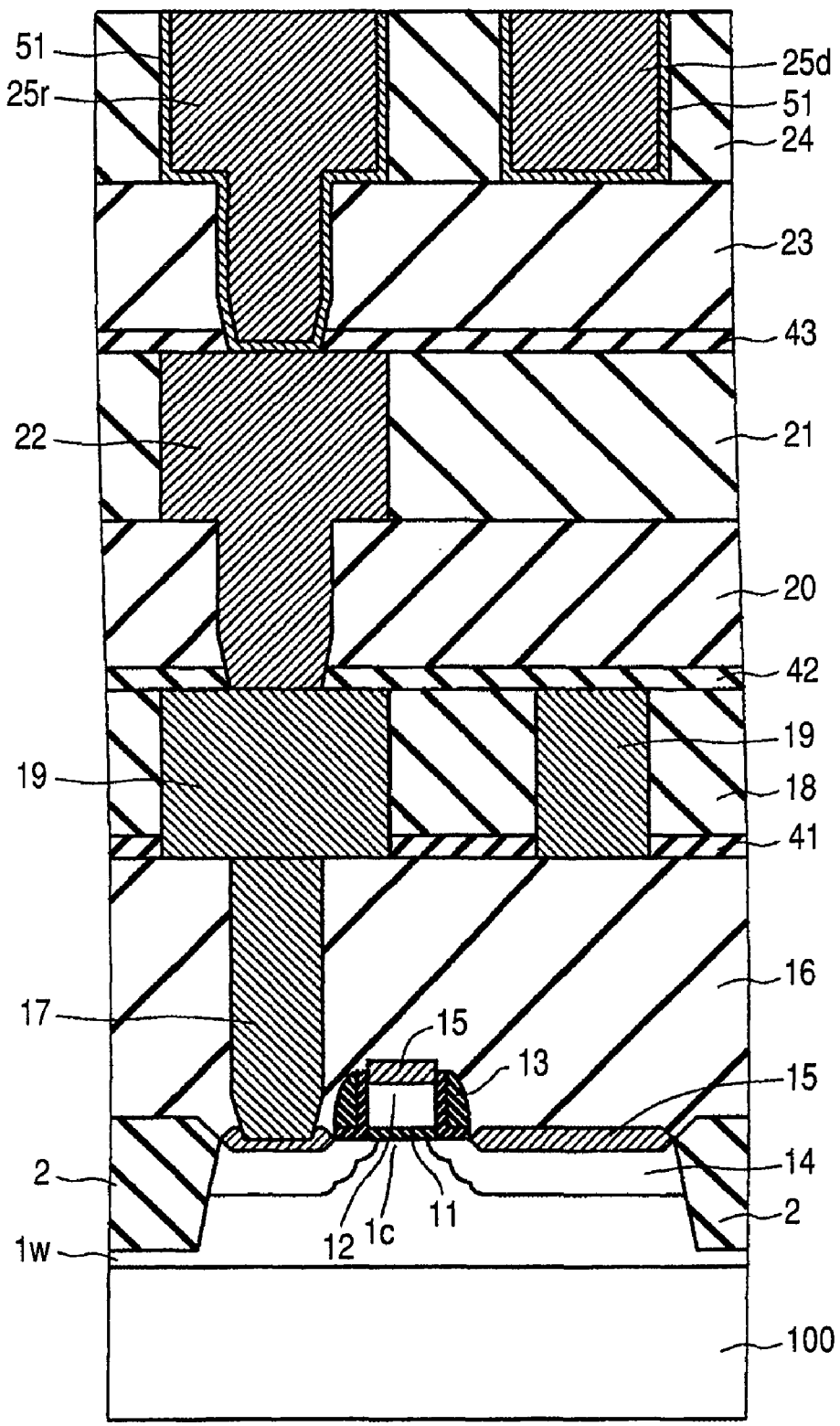
FIG. 11 is a sectional view showing the manufacturing method of an MRAM according to the first embodiment.

Then as shown in FIG. 11, the fine hole 73 and the wiring hole 63 are filled and a Cu wire 25 (a lead wire 25r and a digit line 25d (a word line)) is formed. Then the lead wire 25r is electrically coupled to the Cu wire 22. In this way, the Cu wire 25 as a third layered metal wire and the clad layer 51 are formed by the damascene technology.

Figure 12:
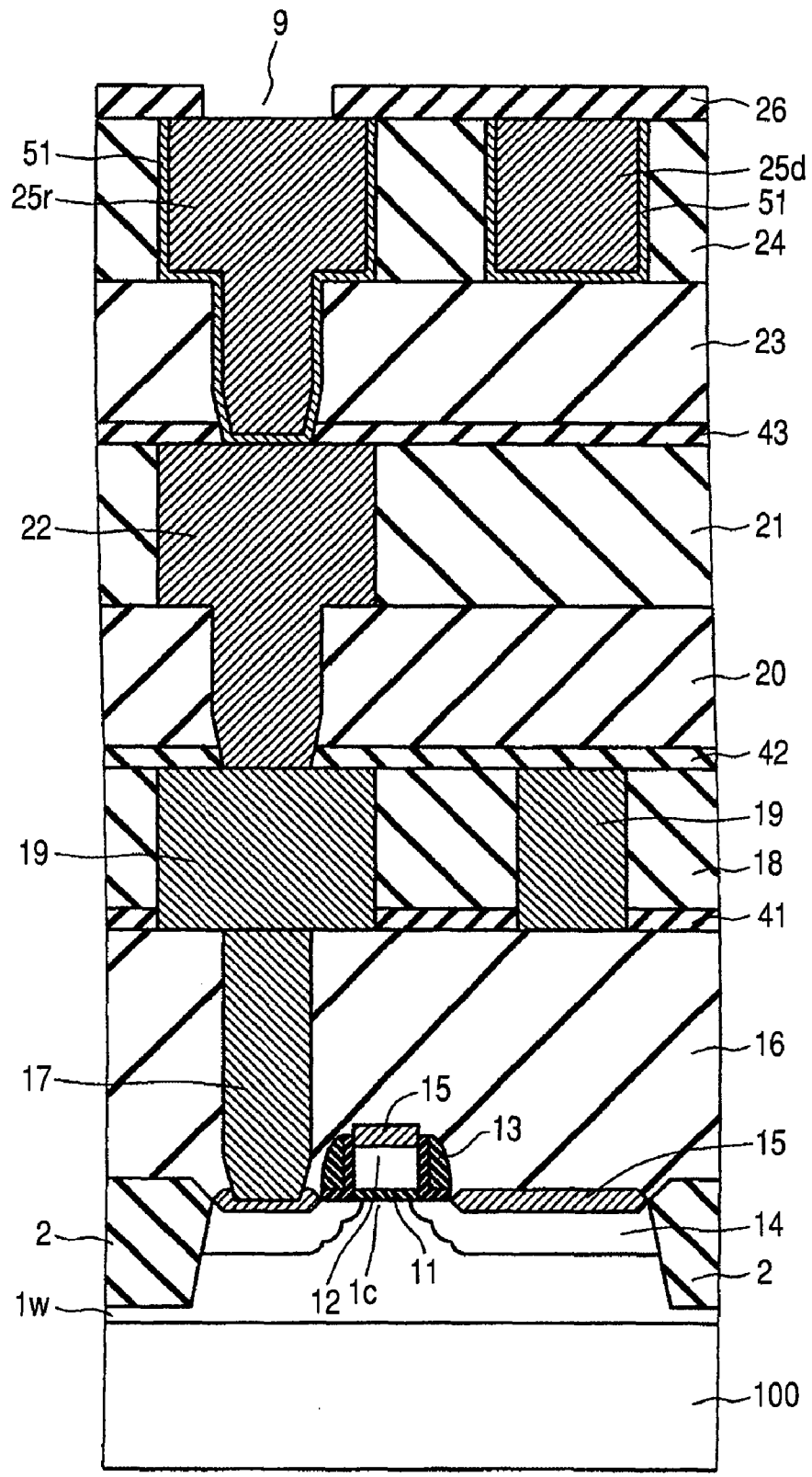
FIG. 12 is a sectional view showing the manufacturing method of an MRAM according to the first embodiment.

Thereafter as shown in FIG. 12, an interlayer dielectric film 26 including a silicon nitride film is formed over the whole surface and a via hole 9 is selectively formed in the manner of penetrating through a part in the region of the lead wire 25r in the memory cell section.

Figure 13:
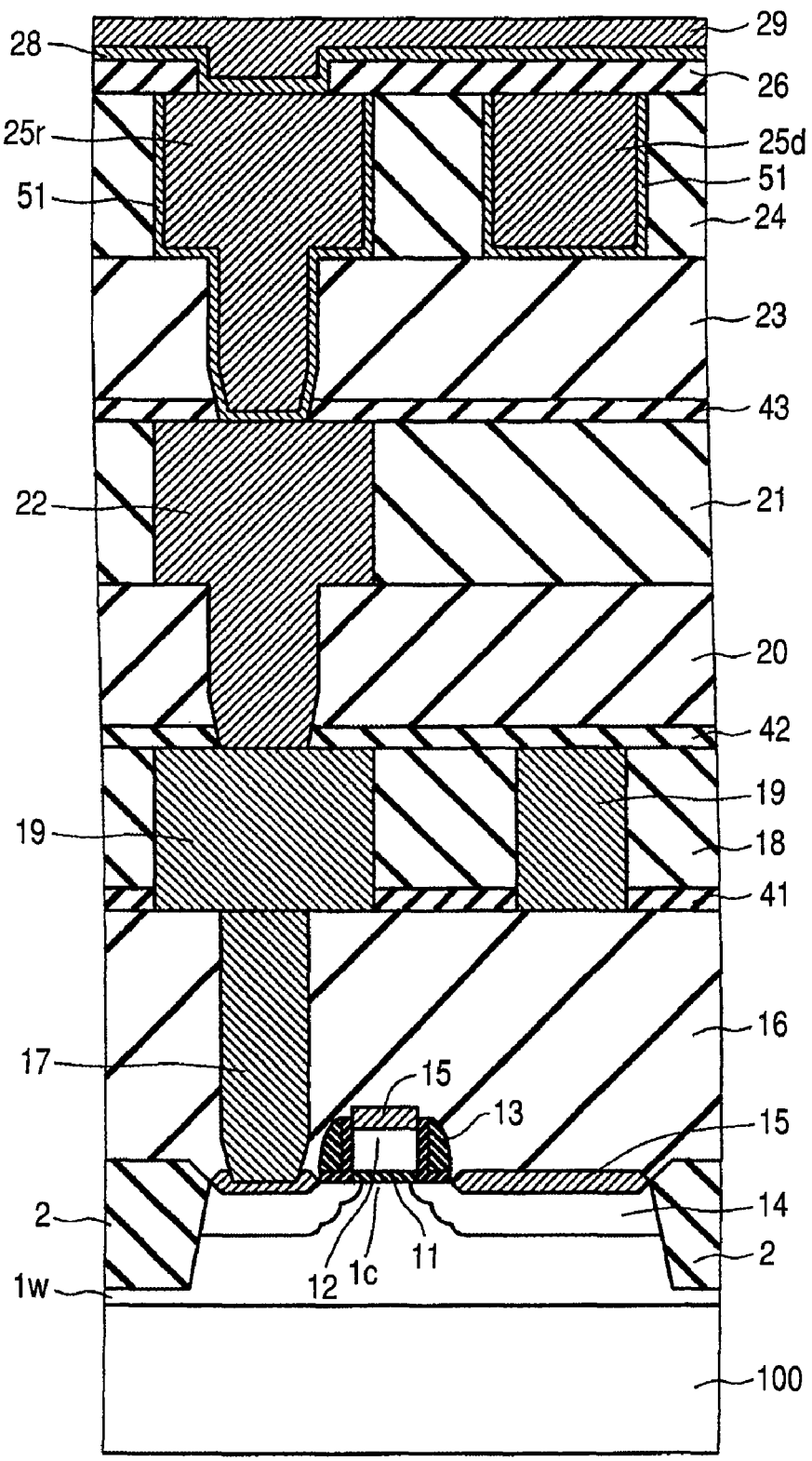
FIG. 13 is a sectional view showing the manufacturing method of an MRAM according to the first embodiment.

Then as shown in FIG. 13, a barrier metal layer 28 is formed over the whole surface including the interior of the via hole 9 and a via embedded metal layer 29 is formed over the barrier metal layer 28.

Figure 14:
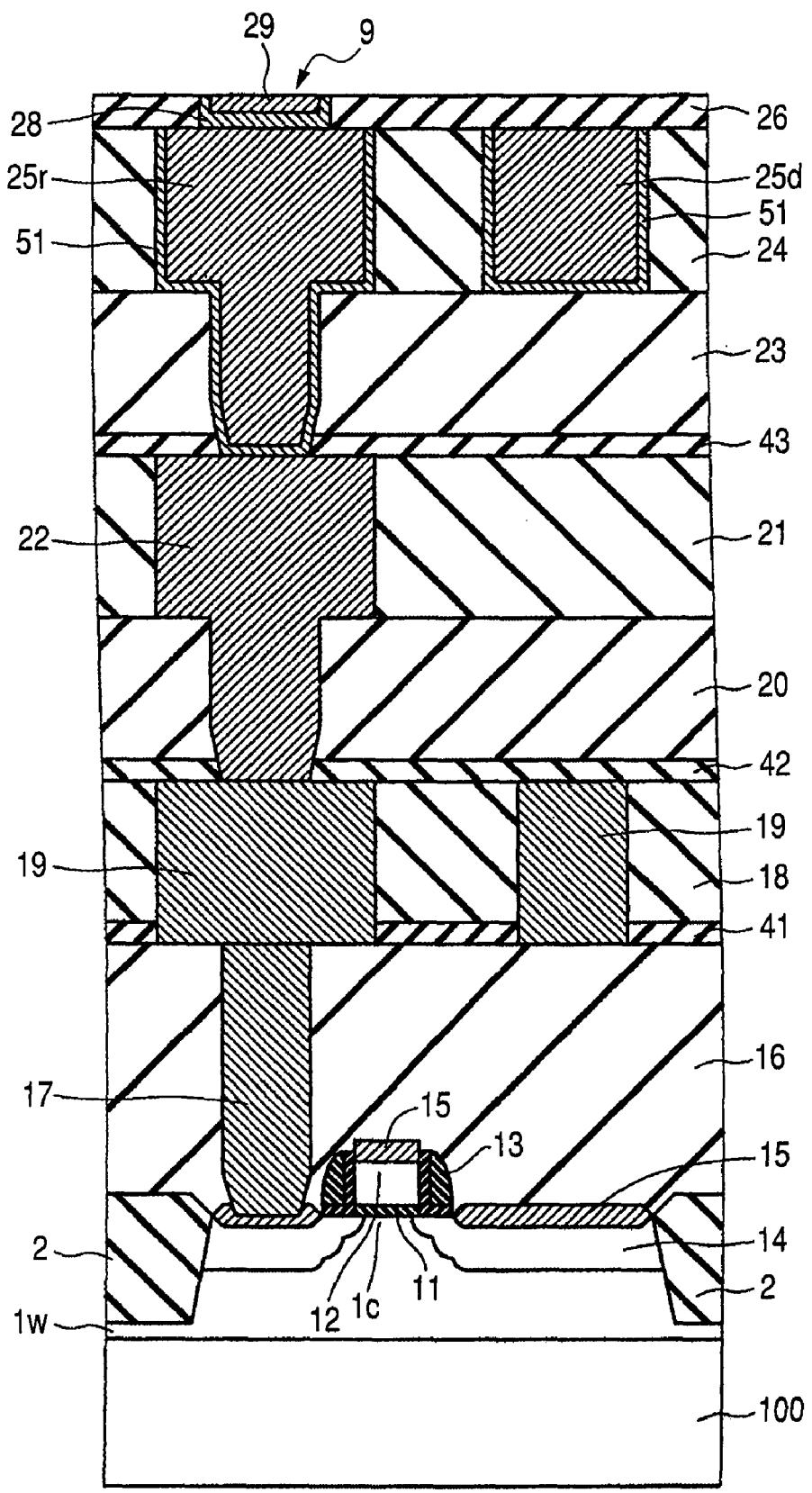
FIG. 14 is a sectional view showing the manufacturing method of an MRAM according to the first embodiment.

Subsequently as shown in FIG. 14, CMP treatment is applied to the barrier metal layer 28 and the via embedded metal layer 29 and only the barrier metal layer 28 and the via embedded metal layer 29 in the via hole 9 are retained.

Figure 15:
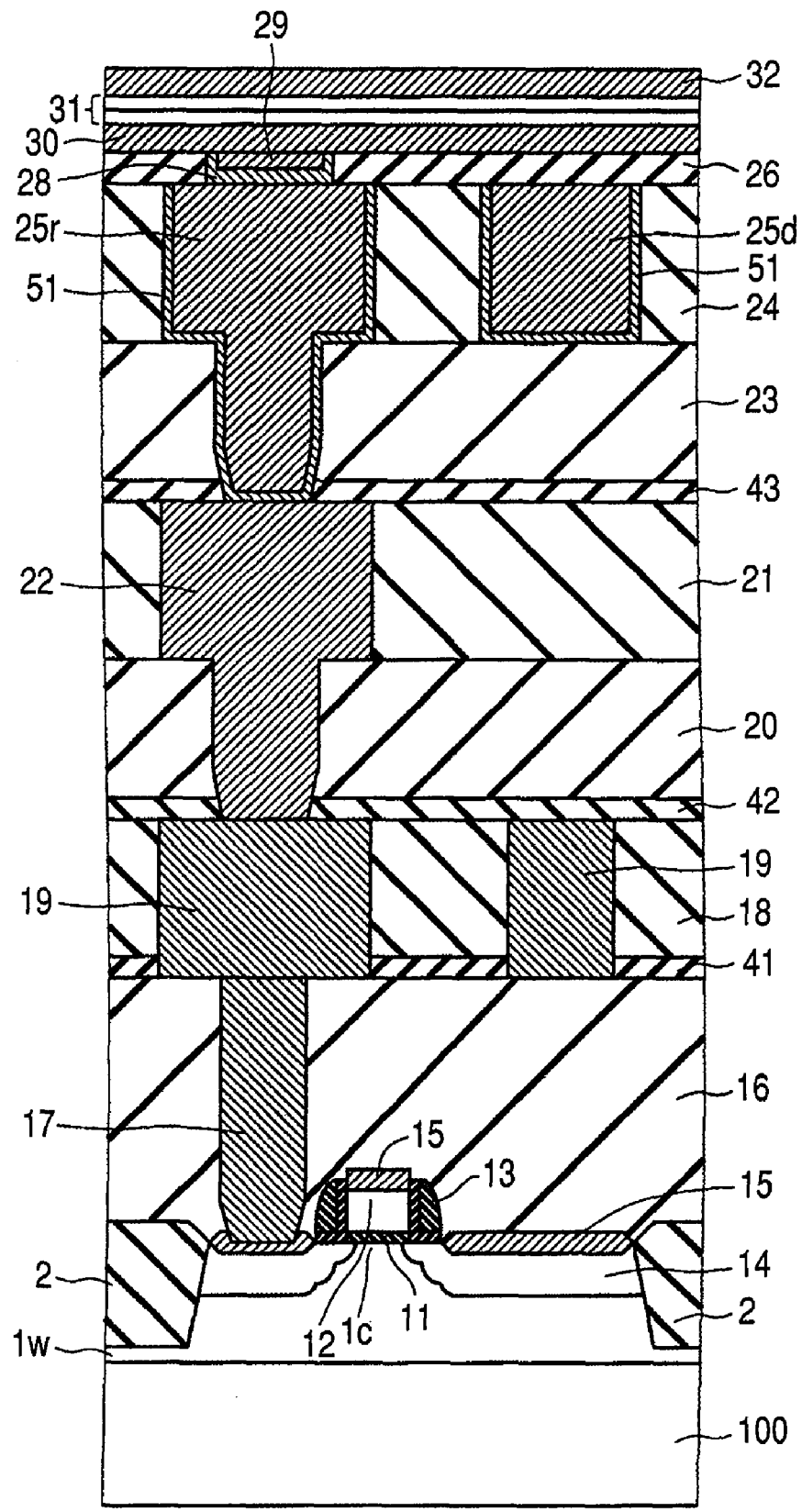
FIG. 15 is a sectional view showing the manufacturing method of an MRAM according to the first embodiment.

Thereafter as shown in FIG. 15, a lower electrode layer 30, an MTJ film 31, and an upper electrode layer 32 are layered over the whole surface. Here, the lower electrode layer 30 and the upper electrode layer 32 use Ta as the constituent material for example and are formed by the sputtering method for example.

Figure 16:
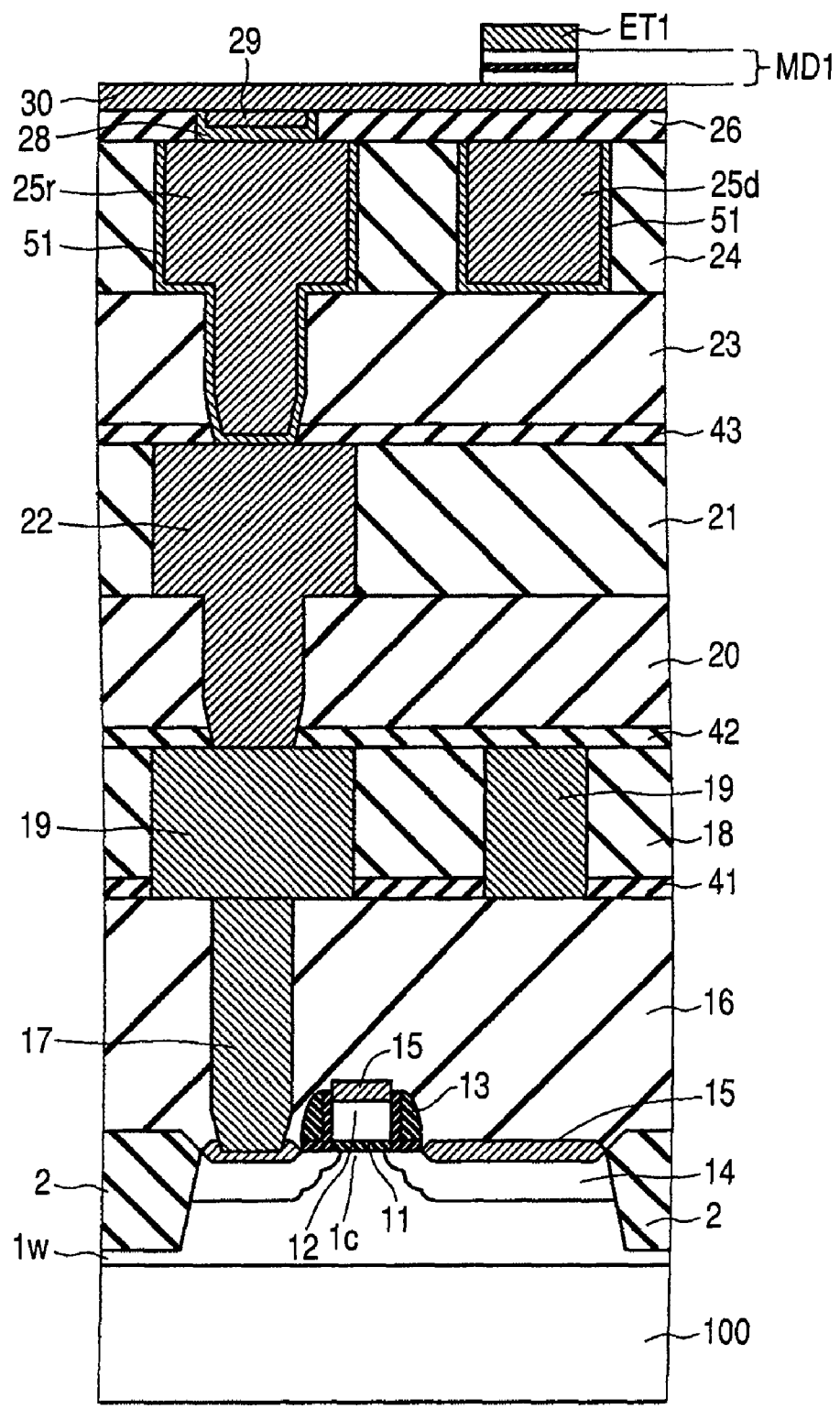
FIG. 16 is a sectional view showing the manufacturing method of an MRAM according to the first embodiment.

Subsequently as shown in FIG. 16, the MTJ film 31 and the upper electrode layer 32 are patterned with a patterned resist not shown in the figure and an MTJ device MD1 and an upper electrode ET1 are obtained. The MTJ device MD1 and the upper electrode ET1 configure an MTJ device section.

Figure 17:
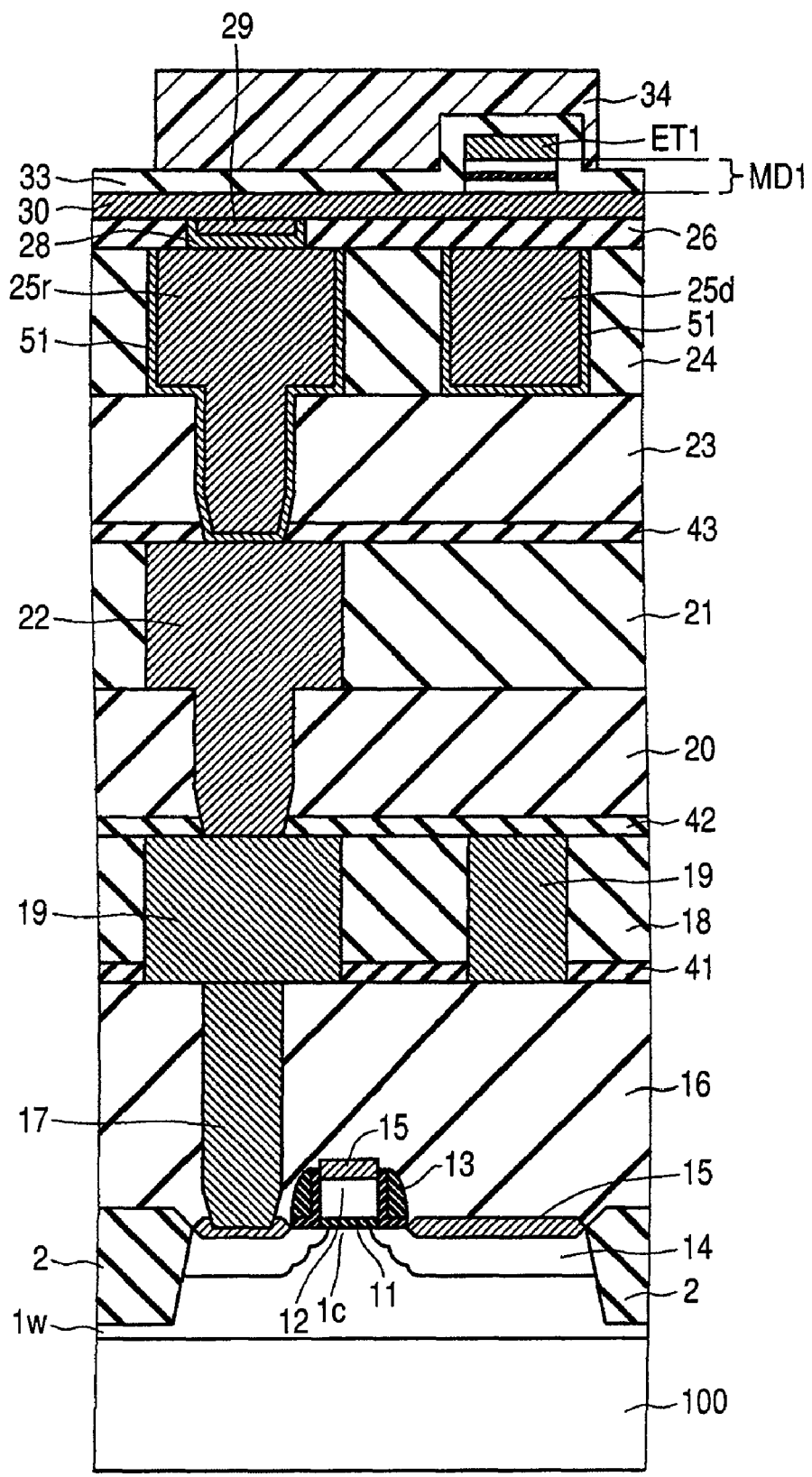
FIG. 17 is a sectional view showing the manufacturing method of an MRAM according to the first embodiment.

Successively as shown in FIG. 17, a silicon nitride film 33 is formed over the whole surface including the MTJ device section (the MTJ device MD1 and the upper electrode ET1). As a result, the silicon nitride film 33 is formed directly on the surface and the side face of the MTJ device MD1. Then a resist pattern 34 is selectively formed over the silicon nitride film 33 by a lithography technology.

Figure 18:
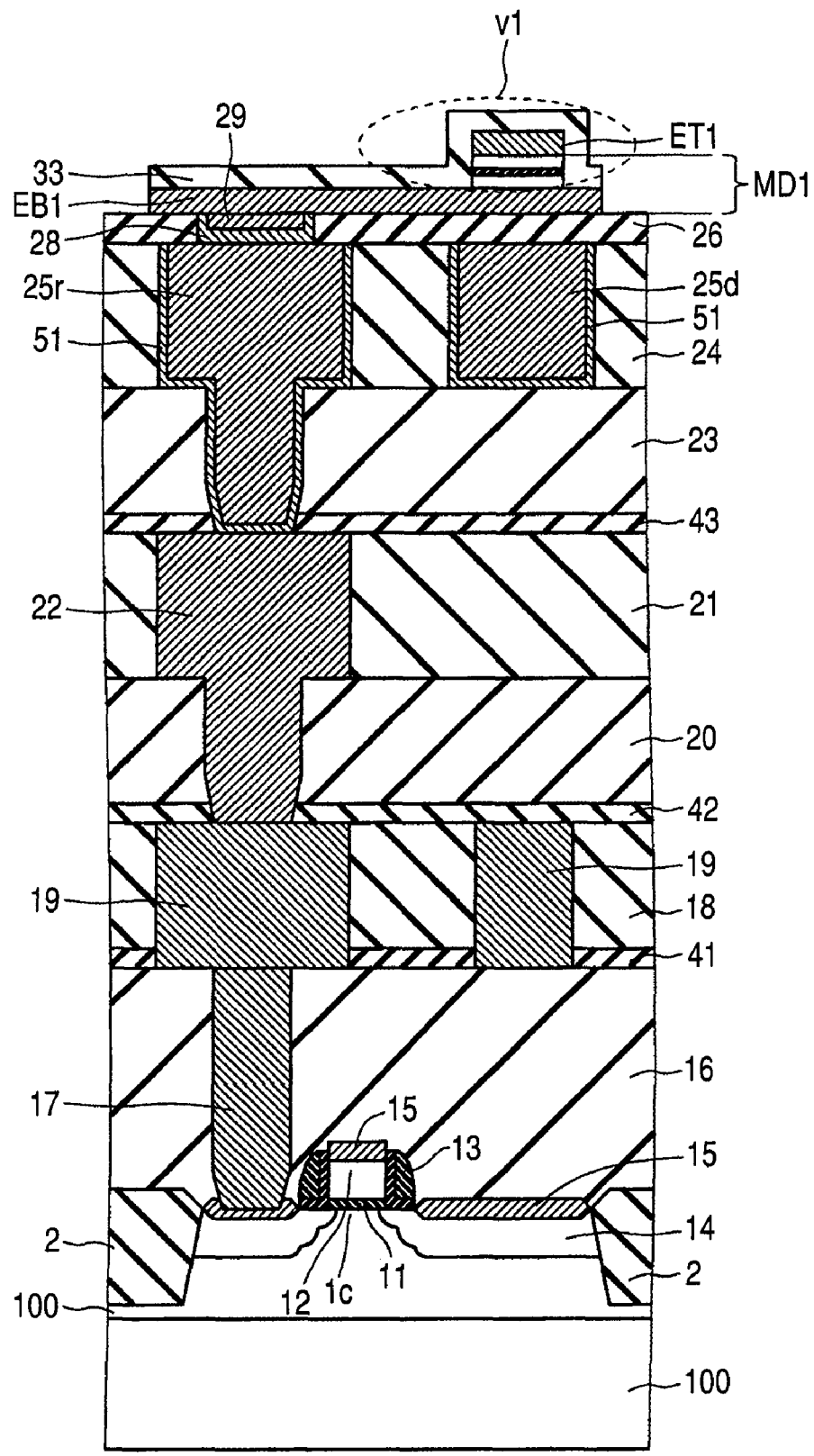
FIG. 18 is a sectional view showing the manufacturing method of an MRAM according to the first embodiment.

Further as shown in FIG. 18, the silicon nitride film 33 and the lower electrode layer 30 are patterned by the dry etching technology by using the resist pattern 34 as a mask and thus the patterned silicon nitride film 33 and lower electrode EB1 are obtained.

In this way, the silicon nitride film 33 and the lower electrode layer 30 are patterned simultaneously and hence the surface and the side face of the MTJ device MD1 are protected by the silicon nitride film 33 when the lower electrode layer 30 is patterned. As a result, it is possible to effectively inhibit electricity leak of the MTJ device MD1 caused by the deposition of the residue of the lower electrode layer 30 onto the side face of the MTJ device MD1 from occurring. Here, since the silicon nitride film 33 and the lower electrode layer 30 are formed with an identical mask, the same shape is obtained in a plan view within the variation in the process.

Figure 19:
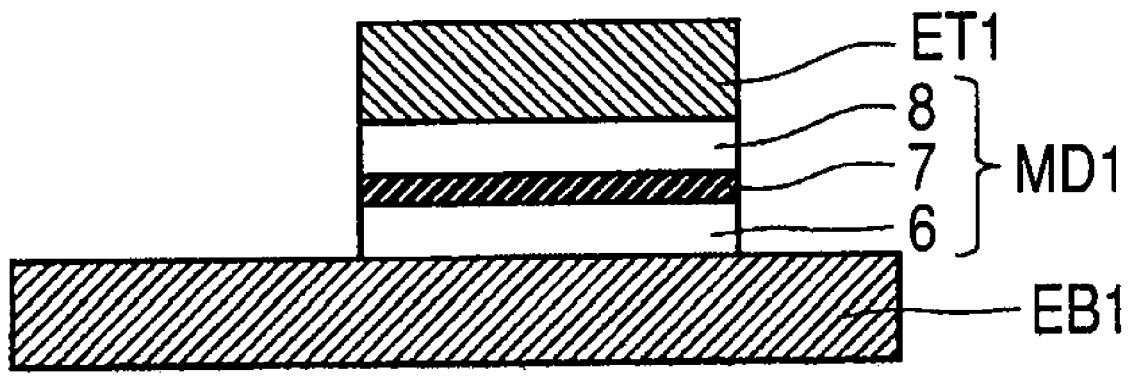
FIG. 19 is a sectional view showing the manufacturing method of an MRAM according to the first embodiment.

FIG. 19 is an explanatory view showing an expanded structure of a focused region v1 in FIG. 18. Here, the silicon nitride film 33 is not shown in the figure. As shown in the figure, the MTJ device section comprising the MTJ device MD1 and the upper electrode ET1 is obtained over the lower electrode EB1. Here, the detailed structure of the MTJ device MD1 takes a layered structure comprising a lower magnetic film 6 (a pinned layer) comprising a ferromagnetic film such as an alloy film or an amorphous film containing Co, Fe, and Ni for example, a tunnel dielectric film 7 comprising $Al_2O_3$ or MgO for example, and an upper magnetic film 8 (a free layer).

Figure 20:
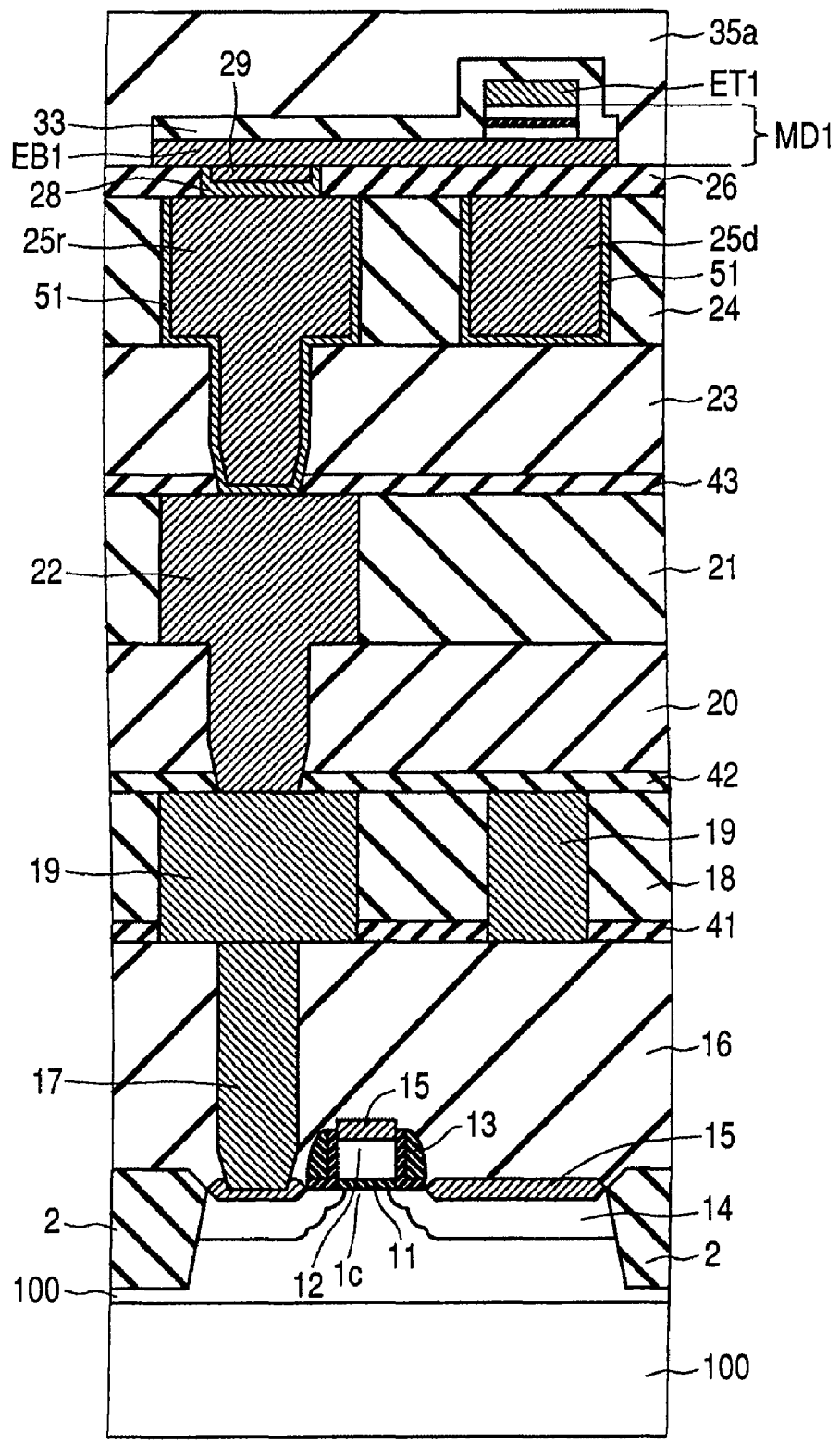
FIG. 20 is a sectional view showing the manufacturing method of an MRAM according to the first embodiment.

Then as shown in FIG. 20, an interlayer dielectric film 35a (a first dielectric region) comprising $SiO_2$ is formed over the whole surface in the manner of covering the whole MTJ device section including the silicon nitride film 33. On this occasion, in the memory cell section, even if hydrogen and moisture diffuse from the interlayer dielectric film 35a, the existence of the silicon nitride film 33 makes it possible to inhibit magnetic damages to the MTJ device MD1. Further, the interlayer dielectric film 35a is flattened by applying the CMP treatment to the interlayer dielectric film 35a.

Explanations are hereunder made in reference to the sectional views in FIGS. 22 to 31. Prior to the explanations referring to FIGS. 22 to 31, a planar structure of an MRAM after the completion of an upper wire shown in FIG. 21 is explained.

As shown in FIG. 21, a lower electrode EB1 having a rectangular shape in a plan view is formed and an MTJ device MD1 (an upper electrode ET1) having an oblong shape in a plan view is formed on the right side of the lower electrode EB1. Further, a silicon nitride film 33 having the same rectangular shape as the lower electrode EB1 in a plan view is formed over the MTJ device MD1. Furthermore, a via hole 40 is formed in the center of the MTJ device MD1. Moreover, a via hole 9 is formed on the left side of the lower electrode EB1 and is electrically coupled to a lead wire 25r below.

Further, a Cu wire 37 is formed as an upper wire (a bit line) in the manner of covering the whole lower electrode EB1 (the silicon nitride film 33) and passing in the transverse direction in the figure. Furthermore, a digit line 25d is formed in the vertical direction in the figure at a lower layer including the whole region where the MTJ device MD1 is formed.

Then, the sectional view of the structure taken on line X-X in FIG. 21 (the sectional view along the center line of the Cu wire 37 (over the via holes 9 and 40) is shown as the views (a) in FIGS. 22 to 31, and the sectional view of the structure taken on line Y-Y in FIG. 21 (the sectional view along the center line of the digit line 25d (over the via hole 40) is shown as the views (b) in FIGS. 22 to 31.

Further, in each of the views (a) to (c) in FIGS. 22 to 31, the structure of the upper part from the interlayer dielectric film 24 is shown and the layers lower than the interlayer dielectric film 24 are not shown. Furthermore, in each of the views (a) and (b) in FIGS. 22 to 31, two units of MTJ devices MD1 are shown and the structure of the interlayer dielectric film 26 comprising the silicon nitride film 26a and the silicon oxide film 26b is shown. A method for manufacturing the structure following the structure shown in FIG. 20 according to the first embodiment is hereunder explained in reference to FIGS. 22 to 31.

Firstly as shown in FIGS. 22(a) and 22(b), at the memory cell section, a via hole 40 is selectively formed above the upper electrode ET1 in the manner of penetrating through the silicon nitride film 33 and the interlayer dielectric film 35a. On this occasion, the silicon nitride film 33 functions as a stopper film when the interlayer dielectric film 35a is penetrated. Along with the formation of the via hole 40, a via hole 40p is formed in the manner of penetrating through the interlayer dielectric film 35a and the interlayer dielectric film 26 (the silicon nitride film 26a and the silicon oxide film 26b) at the periphery circuit section (FIG. 22(c)).

Figure 23A:
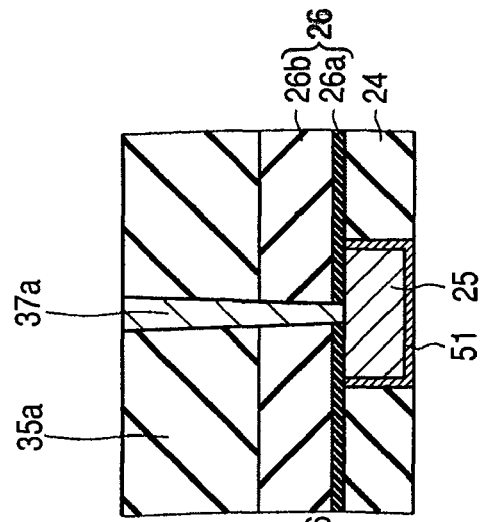
FIGS. 23(a) to 23(c) are sectional views showing the manufacturing method of an MRAM according to the first embodiment.
Figure 23B:
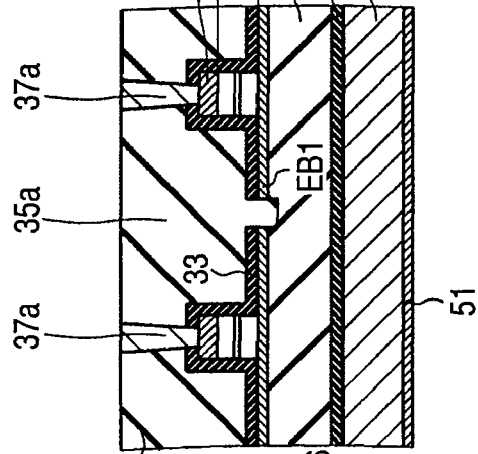
Figure 23C:
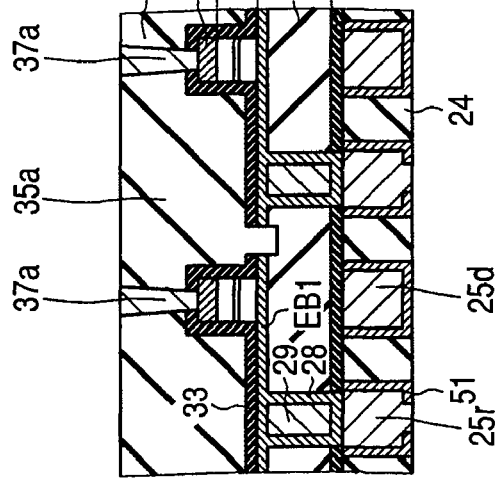

Successively as shown in FIGS. 23(a) and 23(b), a Cu wire 37a is embedded into the via hole 40 at the memory cell section, and the Cu wire (a contact plug) 37a is embedded into the via hole 40p at the periphery circuit section (FIG. 23(c)).

Subsequently as shown in FIGS. 24(a) to 24(c), an interlayer dielectric film 35b (a second dielectric region) comprising SiO₂ or the like is formed over the whole surface for example by the HDP-CVD (High Density Plasma Chemical Vapor Deposition) method at a low temperature of 300° C. or lower, and thereafter the interlayer dielectric film 35b is flattened by applying the CMP treatment to the interlayer dielectric film 35b. Thereafter as shown in FIGS. 24(a) to 24(c), a trench 36 is formed in the manner of selectively penetrating through the interlayer dielectric film 35b at both the memory cell section (FIGS. 24(a) and 24(b)) and the periphery circuit section (FIG. 24(c)). On this occasion, the trench 36 is formed so that the surface of the Cu wire 37a may be exposed.

Figures 25A, 25B, 25C:
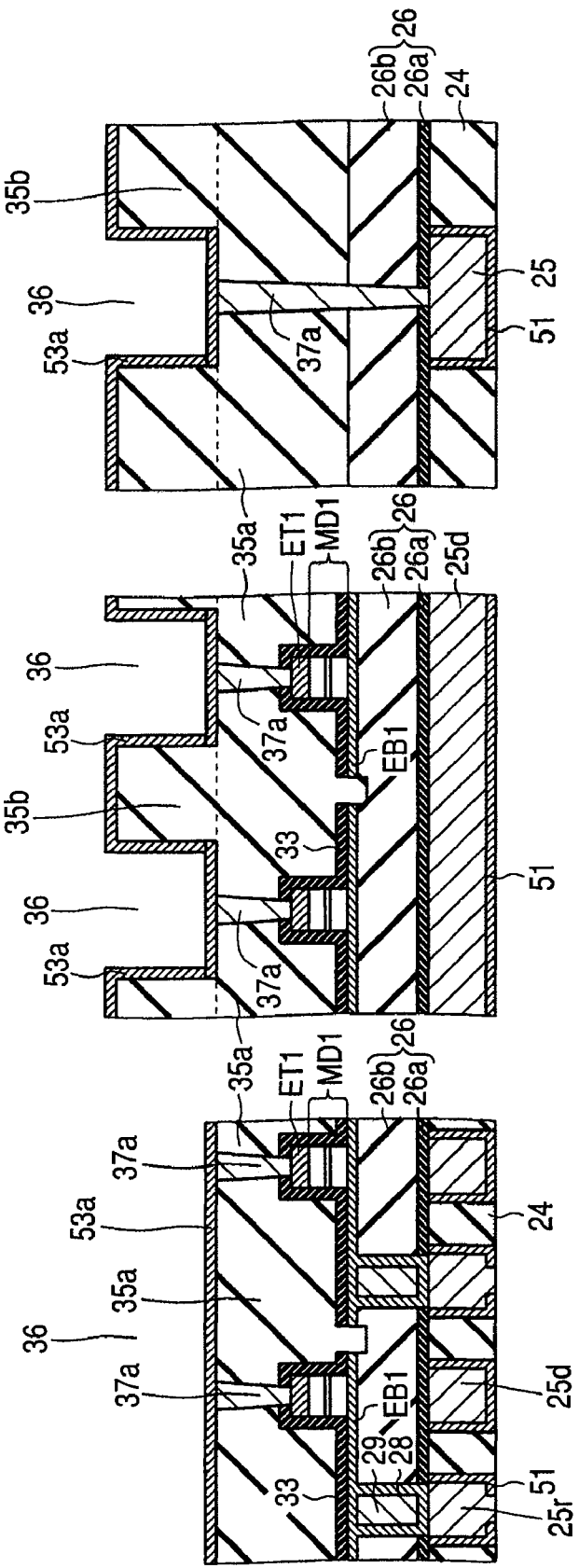
FIGS. 25(a) to 25(c) are sectional views showing the manufacturing method of an MRAM according to the first embodiment.

Then as shown in FIGS. 25(a) to 25(c), a clad layer 53a of a prescribed thickness for magnetic shielding is formed over the bottom face and the side face of the trench 36 and over the interlayer dielectric film 35b by the sputtering method. Here, as the constituent material for the clad layer 53a, a material having the same characteristics as the clad layer 51 is desirable.

Thereafter as shown in FIGS. 26(a) to 26(c), the clad layer 53a formed over the bottom face of the trench 36 and over the interlayer dielectric film 35b is selectively removed by etch back.

Then as shown in FIGS. 27(a) to 27(c), a bit line is obtained by embedding a Cu wire 37b into the trench 36 and forming the Cu wire 37b. As a result, the Cu wire 37b at the memory cell section (FIGS. 27(a) and 27(b)) is electrically coupled to the upper electrode ET1 of the MTJ device MD1 through the Cu wire 37a. In the same way, the Cu wire 37b at the periphery circuit section (FIG. 27(c)) is electrically coupled to the Cu wire 25 through the Cu wire 37a. In this way, the Cu wire 37 (37a and 37b) functioning as a fourth layered metal wire and a main wiring section is formed. Here, the Cu wire 37 may also be formed integrally by dual damascene.

Thereafter as shown in FIGS. 28(a) to 28(c), a clad layer 53b of a prescribed thickness for magnetic shielding is formed over the whole surface. Here, as the constituent material for the clad layer 53b, a material having the same characteristics as the clad layer 51 is desirable.

Figure 29A:
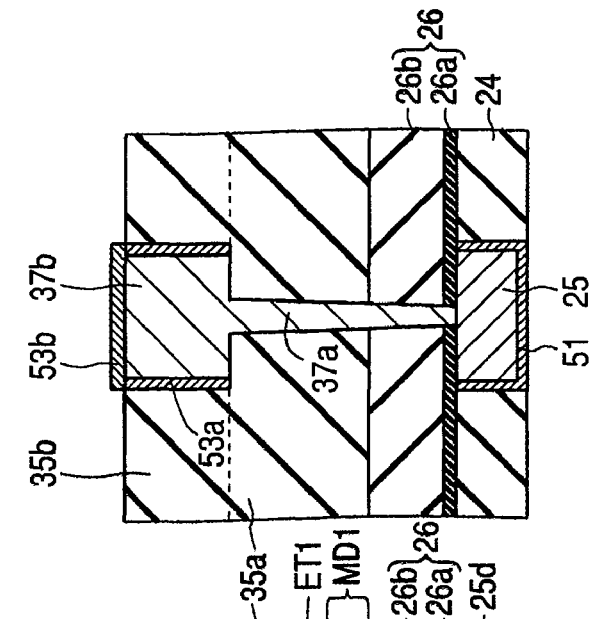
FIGS. 29(a) to 29(c) are sectional views showing the manufacturing method of an MRAM according to the first embodiment.
Figure 29B:
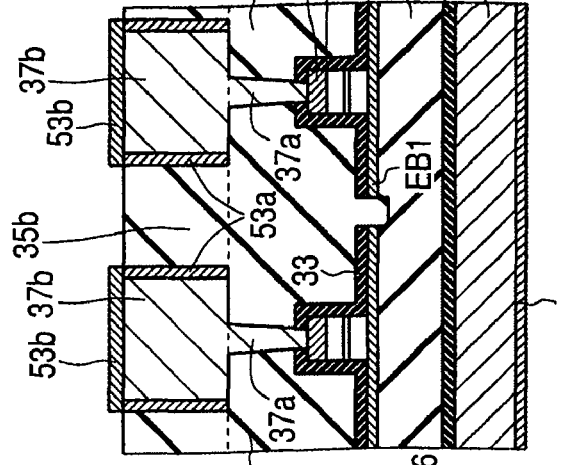
Figure 29C:
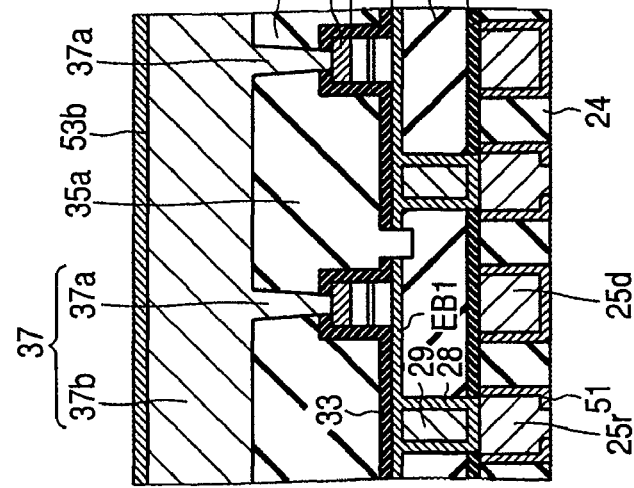

Further as shown in FIGS. 29(a) to 29(c), the clad layer 53b is selectively removed so that the clad layer 53b may be retained only over the Cu wire 37b.

Successively as shown in FIGS. 30(a) to 30(c), a silicon nitride film 55 is formed over the whole surface as a liner film for the Cu wire 37b. Thereafter as shown in FIGS. 31(a) to 31(c), an interlayer dielectric film 56 comprising SiO₂ or the like is formed over the whole surface for example by the HDP-CVD method at a low temperature of 300° C. or lower, and thereby an MRAM having the memory cell section comprising the lower electrode EB1, the MTJ device MD1, and the upper electrode ET1 according to the first embodiment shown in FIGS. 1 to 31 is completed.

(Method for Forming Silicon Nitride Film 55)

Figure 32:
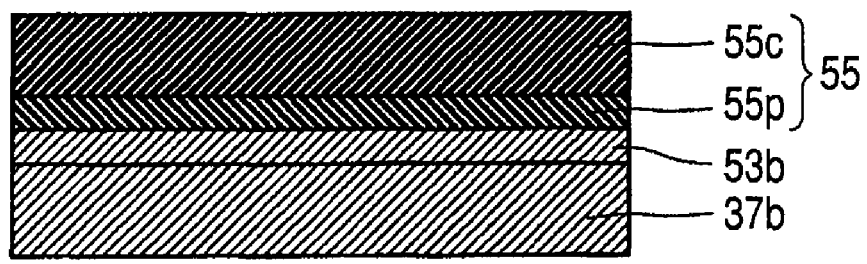
FIG. 32 is an explanatory view showing an expanded structure in a focused region in a memory cell section in FIGS. 30(a) to 30(c).

FIG. 32 is an explanatory view showing an expanded structure in the focused region v2 and v3 at the memory cell section in FIGS. 30(a) and 30(b).

As shown in the figure, the silicon nitride film 55 formed over the clad layer 53b is configured by the layered structure comprising a tensile stress silicon nitride film 55p and a compressive stress silicon nitride film 55c. This is hereunder described in detail.

Firstly, plasma treatment is applied with reducible NH₃ or H₂ as pretreatment before the silicon nitride film 55 is formed.

Thereafter, the tensile stress silicon nitride film 55p to impose tensile stress on the MTJ device MD1 is formed over the clad layer 53b and the interlayer dielectric film 35b where the clad layer 53b is not formed.

Subsequently, the compressive stress silicon nitride film 55c to impose compressive stress on the MTJ device MD1 is formed over the tensile stress silicon nitride film 55p.

An example of the conditions for forming the tensile stress silicon nitride film 55p and the compressive stress silicon nitride film 55c is as follows.

Firstly, a parallel plate type plasma CVD apparatus is used as the apparatus for forming the tensile stress silicon nitride film 55p and the compressive stress silicon nitride film 55c. Then silane (SiH₄)/ammonia (NH₃)/nitrogen gas (N₂) are used as the film forming gas.

For example, the flow rates of SiH₄, NH₃, and N₂ can be set at 10 to 500 (sccm), 10 to 500 (sccm), and 10 to 50,000 (sccm), respectively.

Further, the pressure during film forming is set to 1 to 21 (Torr), the electrode interval between the parallel plates in the parallel plate type plasma CVD apparatus is set at 5 to 15 mm, and the RF power (13.56 MHz) is set at 0.03 to 0.4 W/cm². Further, the film forming temperature is set at 200° C. to 350° C. so as not to exert a bad influence on the magnetic property of the magnetic material for the MTJ device MD1.

Here, the upper limit of the temperature at which the electric and magnetic properties of the magnetic material for the MTJ device MD1 are not badly influenced is 300° C. in the case where the constituent material for the tunnel dielectric film 7 configuring the MTJ device MD1 is aluminum oxide (AlO$_x$) such as alumina (Al₂O₃) and 350° C. in the case where the constituent material for the tunnel dielectric film 7 is magnesium oxide (MgO).

Consequently, when the silicon nitride film 55 is formed in consideration of the electric and magnetic properties of the magnetic material for the MTJ device, an ideal film forming temperature is in the range of 200° C. to 300° C. in the case where the constituent material for the tunnel dielectric film 7 configuring the MTJ device MD1 is AlO$_x$ and in the range of 200° C. to 350° C. in the case where the constituent material for the tunnel dielectric film 7 is MgO.

The reason why the upper limit of the temperature is different between AlO$_x$ and MgO as the constituent material for the tunnel dielectric film 7 is as follows. AlO$_x$ is used in the state of amorphous and MgO is used in the state of crystal as the tunnel dielectric film 7 (a tunnel barrier). Consequently, annealing is required for crystallization in the case of MgO and a temperature of about 350° C. is necessary as the annealing temperature. If annealing temperature is raised excessively however, the magnetic property of the pin layer in the MTJ device MD1 deteriorates. In consideration of the concern, the upper limit of the temperature is set at 350° C. On the other hand, in the case of AlO$_x$, the material is used in the state of amorphous as stated above and hence annealing for crystallization is not required. Consequently, a low temperature process of about 300° C. is required and thus the upper limit of the temperature is set at 300° C.

In the range of the film forming conditions, the tensile stress and the compressive stress of the formed silicon nitride film can easily be set and controlled by the method of setting the proportion of the gas flow rates of SiH₄, NH₃, and N₂ in the film forming gas, the pressure during film forming, and others. For example, the compressive stress can be increased by lowering the pressure during film forming and the tensile stress can be increased by raising the pressure during film forming.

(Effect)

The effect caused by forming the silicon nitride film 55 in the order of firstly the tensile stress silicon nitride film 55p and then the compressive stress silicon nitride film 55c is hereunder explained.

In the case where only the tensile stress silicon nitride film 55p is formed as the silicon nitride film 55, the deterioration of the magnetic property in the MTJ device MD1 can be inhibited. The reason is that the tensile stress silicon nitride film 55p can be formed with a low RF power (0.4 W/cm$^2$ or lower) while the aforementioned film forming conditions are satisfied and hence the plasma damages imposed on the MTJ device MD1 can be reduced.

In the case where only the tensile stress silicon nitride film 55p is formed however, the reliability (EM (Electromigration), TDDB (Time Dependence on Dielectric Breakdown), and others) of the Cu wire 37 lowers undesirably.

To cope with that, the compressive stress silicon nitride film 55c is further formed over the tensile stress silicon nitride film 55p. The compressive stress silicon nitride film 55c has the function of improving the reliability such as EM, TDDB, and others of the Cu wire 37 and hence the reliability of the Cu wire 37 can be improved.

Moreover, the compressive stress silicon nitride film 55c can also be formed with a low RF power in the same way as the tensile stress silicon nitride film 55p and hence it is possible to exhibit the effect of inhibiting the deterioration of the magnetic property in the MTJ device MD1.

Further, in order to form the silicon nitride film 55 with a good adhesiveness, it is necessary to deposit the silicon nitride film 55 in the order of firstly the tensile stress silicon nitride film 55p and then the compressive stress silicon nitride film 55c.

One of the reasons is presumably that, since the tensile stress silicon nitride film 55p has a low density and is vulnerable in nature, it is possible to prevent the tensile stress silicon nitride film 55p from absorbing moisture by covering the surface thereof with the compressive stress silicon nitride film 55c of a high density.

Another reason is as follows. Whereas the tensile stress silicon nitride film 55p is excellent in adhesiveness with a conductive layer such as Cu or iron, cobalt, or nickel used for a clad layer but is inferior in adhesiveness with an interlayer dielectric film in comparison with the compressive stress silicon nitride film 55c, the compressive stress silicon nitride film 55c is inferior in adhesiveness with a conductive layer but is excellent in adhesiveness with an interlayer dielectric film in comparison with the tensile stress silicon nitride film 55p. Consequently, the compressive stress silicon nitride film 55c is excellent in adhesiveness with an interlayer dielectric film as an upper layer and also the tensile stress silicon nitride film 55p is excellent in adhesiveness with the clad layer 53b, and hence exfoliation can be inhibited effectively. It is estimated that, for that reason, the tensile stress silicon nitride film 55p and the compressive stress silicon nitride film 55c function so as to compensate the drawbacks of each other.

Further, in the case where the silicon nitride film 55 comprises only the compressive stress silicon nitride film 55c, it is concerned that exfoliation may occur at a portion, having a poorer adhesiveness, of a layer under the compressive stress silicon nitride film 55c. In the first embodiment however, since the tensile stress silicon nitride film 55p is formed under the compressive stress silicon nitride film 55c in the silicon nitride film 55, the concern can be avoided effectively.

If the tensile stress silicon nitride film 55p is too thick, the reliability of the Cu wire 37 deteriorates. It is desirable therefore to form the compressive stress silicon nitride film 55c so as to be thicker than the tensile stress silicon nitride film 55p. A conceivable example is that the thickness of the tensile stress silicon nitride film 55p is set at not more than 20% of the total thickness of the silicon nitride film 55 and the thickness of the compressive stress silicon nitride film 55c is set at not less than 80% of the total thickness.

It is possible to increase the reliability of the Cu wire 37 without fail by forming the compressive stress silicon nitride film 55c thicker than the tensile stress silicon nitride film 55p.

Figure 33:
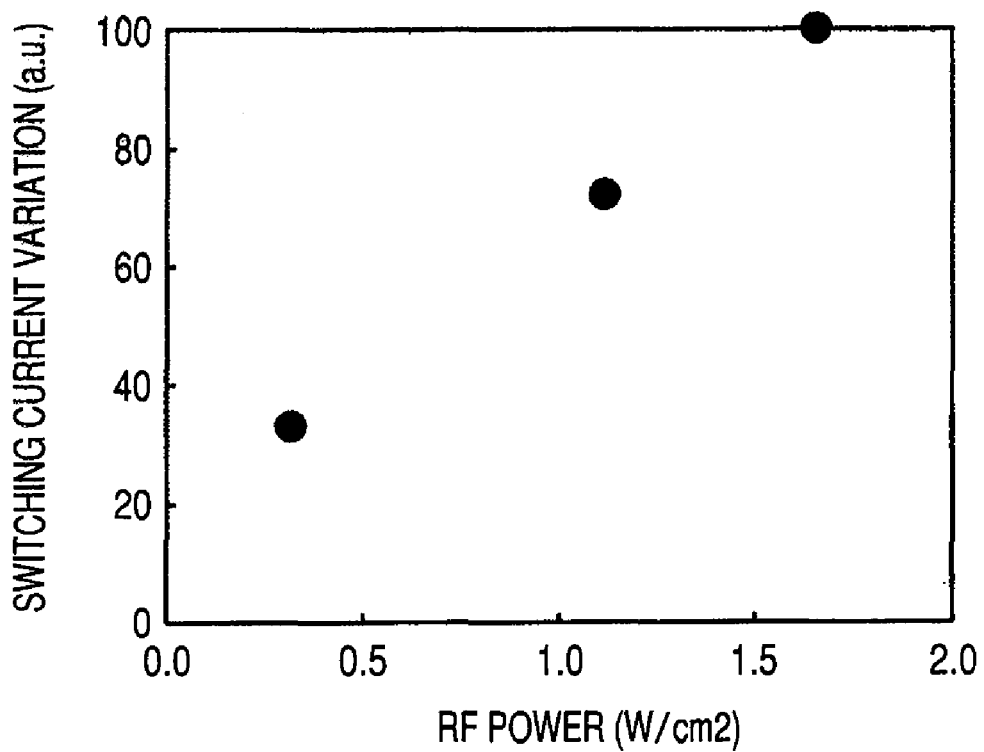
FIG. 33 is a graph showing the relationship between RF power used when a silicon nitride film is formed over an upper wire in an MTJ device and the switching current variation of the MTJ device.

FIG. 33 is a graph showing the relationship between an RF power that is one of the film forming conditions used when the silicon nitride film 55 (the tensile stress silicon nitride film 55p and the compressive stress silicon nitride film 55c) is formed and a switching current variation of the MTJ device MD1. In the figure, the RF power is shown along the horizontal axis and the writing current variation (a.u. (arbitrary unit)) is shown along the vertical axis.

As shown in the figure, it is understood that, even in the case where the RF power is in the vicinity of 0.4 (W/cm$^2$) that is the maximum RF power in the film forming condition, the variation can be suppressed by 60% or more in comparison with the case where the RF power is about 1.6 (W/cm$^2$).

In this way, it is possible to effectively inhibit the magnetic property of the MTJ device MD1 from deteriorating by forming the silicon nitride film 55 with a relatively low RF power (maximum 0.4 and ideally 0.1 (W/cm$^2$)).

In this way, in the MRAM according to the first embodiment, the silicon nitride film 55 of the layered structure comprising the tensile stress silicon nitride film 55p and the compressive stress silicon nitride film 55c is formed over the clad layer 53b configuring the upper wiring section together with the Cu wire 37b, namely over the upper wiring section. On this occasion, the tensile stress silicon nitride film 55p is formed first and thereafter the compressive stress silicon nitride film 55c is formed.

Since both the tensile stress silicon nitride film 55p and the compressive stress silicon nitride film 55c can be formed under the film forming condition of a relatively low RF power, it is possible to minimize damages to the MTJ device MD1 and thereby to avoid an adverse influence on the properties of the magnetic films (the lower magnetic film 6 and the upper magnetic film 8) in the MTJ device MD1.

Further, since the compressive stress silicon nitride film 55c having the function of improving the reliability of the Cu wire 37 is formed, it is possible to improve the reliability of the upper wiring section.

Furthermore, by forming the tensile stress silicon nitride film 55p first and then forming the compressive stress silicon nitride film 55c, it is possible to form the silicon nitride film 55 with a good adhesiveness over the clad layer 53b and the interlayer dielectric film 35b.

Yet further, it is ideal that the tensile stress silicon nitride film 55p has a tensile stress of 300 MPa or more and the compressive stress silicon nitride film 55c has a compressive stress of 1,000 MPa or more. By forming the tensile stress silicon nitride film 55p and the compressive stress silicon nitride film 55c having such a tensile stress and a compressive stress respectively, it is possible to improve the reliability of the Cu wire 37 more consistently while the film forming temperature is satisfied.

Moreover, by forming the tensile stress silicon nitride film 55p and the compressive stress silicon nitride film 55c under the film forming condition of 350° C. or lower, it is possible to inhibit the properties of the magnetic film in the MTJ device MD1 from being adversely influenced by the film forming temperatures of the tensile stress silicon nitride film 55p and the compressive stress silicon nitride film 55c.

In addition, since plasma treatment is applied with reducible $NH_3$ or $H_2$ as pretreatment before the tensile stress silicon nitride film 55p and the compressive stress silicon nitride film 55c are formed, it is possible to enhance adhesiveness when the tensile stress silicon nitride film 55p and the compressive stress silicon nitride film 55c are formed successively.

Second Embodiment

FIGS. 34(*a*) to 34(*c*) are sectional views showing the structure of an MRAM according to the second embodiment of the present invention. In FIGS. 34(*a*) to 34(*c*), FIG. 34(*a*) represents a sectional view taken on line X-X in FIG. 21, FIG. 34(*b*) represents a sectional view taken on line Y-Y in FIG. 21, and FIG. 34(*c*) represents a cross-sectional structure at a periphery circuit section different from a memory cell section.

The MRAM according to the second embodiment differs from the first embodiment in that the silicon nitride film 55 is not formed over the clad layer 53b unlike the first embodiment but is selectively formed only over the interlayer dielectric film 35b where the clad layer 53b is not formed.

A method for manufacturing an MRAM according to the second embodiment is explained hereunder. The MRAM is manufactured in the same way as the first embodiment until the structure shown in FIGS. 30(*a*) to 30(*c*) is obtained.

Thereafter as shown in FIGS. 34(*a*) to 34(*c*), a silicon nitride film 55 is formed over the whole surface, the silicon nitride film 55 over the Cu wire 37b is selectively removed, and thereafter a clad layer 53b is selectively formed over the Cu wire 37b. Then an interlayer dielectric film 56 comprising $SiO_2$ is formed over the whole surface and the MRAM according to the second embodiment shown in FIGS. 34(*a*) to 34(*c*) is completed.

In this way, in the MRAM according to the second embodiment, the silicon nitride film 55 of the layered structure comprising the tensile stress silicon nitride film 55p and the compressive stress silicon nitride film 55c is formed over the interlayer dielectric film 35b including the region in the vicinity of the upper wiring section where the upper wiring section comprising the Cu wire 37b and the clad layer 53b is not formed.

As a result, in the MRAM according to the second embodiment, it is possible to increase the reliability of the upper wiring section without adverse effects on the properties of the magnetic film in the MTJ device MD1 in the same way as the first embodiment.

Third Embodiment

FIGS. 35(*a*) to 35(*c*) are sectional views showing the structure of an MRAM according to the third embodiment of the present invention. FIG. 35(*a*) represents a sectional view taken on line X-X in FIG. 21, the FIG. 35(*b*) represents a sectional view taken on line Y-Y in FIG. 21, and FIG. 35(*c*) represents a cross-sectional structure at a periphery circuit section different from a memory cell section.

The MRAM according to the third embodiment differs from the first embodiment in that the clad layers 53a and 53b are not formed unlike the first embodiment.

A method for manufacturing an MRAM according to the third embodiment is explained hereunder. The MRAM is manufactured in the same way as the first and second embodiments until the structure shown in FIGS. 24(*a*) to 24(*c*) is obtained.

Thereafter as shown in FIGS. 27(*a*) to 27(*c*) (note that the clad layer 53b does not exist), a bit line is obtained by embedding a Cu wire 37b into a trench 36 and forming the Cu wire 37b. As a result, the Cu wire 37b in the memory cell section (FIGS. 27(*a*) and 27(*b*)) is electrically coupled to the upper electrode ET1 in the MTJ device MD1 through the Cu wire 37a. In the same way, the Cu wire 37b in the peripheral circuit section (FIG. 27(*c*)) is electrically coupled to the Cu wire 25 through the Cu wire 37a. In this way, the Cu wire 37 (37a and 37b) is formed as a fourth layered metal wire.

Here, a method of forming the Cu wires 37a and 37b simultaneously by the damascene technology after the via hole 40 (40p) and the trench 36 are formed in place of the processes shown in FIGS. 22 to 24 and 27 is also conceivable.

Successively as shown in FIGS. 35(*a*) to 35(*c*), after a silicon nitride film 55 is formed over the whole surface, an interlayer dielectric film 56 comprising $SiO_2$ is formed over the whole surface and the MRAM according to the third embodiment shown in FIGS. 35(*a*) to 35(*c*) is completed.

In this way, in the MRAM according to the third embodiment, the silicon nitride film 55 of the layered structure comprising the tensile stress silicon nitride film 55p and the compressive stress silicon nitride film 55c is formed over the Cu wire 37b configuring the upper wiring section by itself.

As a result, in the MRAM according to the third embodiment, it is possible to increase the reliability of the upper wiring section without adverse effects on the properties of the magnetic film in the MTJ device MD1 in the same way as the first embodiment.

FIGS. 36(*a*) to 36(*c*) are sectional views showing a modified example of the structure of an MRAM according to the third embodiment of the present invention. In FIGS. 36(*a*) to 36(*c*), FIG. 36(*a*) represents a sectional view taken on line X-X in FIG. 21, FIG. 36(*b*) represents a sectional view taken on line Y-Y in FIG. 21, and FIG. 36(*c*) represents a cross-sectional structure at a periphery circuit section different from a memory cell section.

As shown in FIGS. 36(*a*) to 36(*c*), in the modified example of the third embodiment, after a silicon nitride film 55 comprising a tensile stress silicon nitride film 55p and a compressive stress silicon nitride film 55c is formed, a clad layer 53b is formed over the silicon nitride film 55 so as to cover the Cu wire 37b in a plan view. On this occasion, the whole Cu wire 37b may be completely covered or only a part of the Cu wire 37b may be covered with the silicon nitride film 55.

In this way, in the MRAM according to the modified example of the third embodiment, the silicon nitride film 55 of the layered structure comprising the tensile stress silicon nitride film 55p and the compressive stress silicon nitride film 55c is formed over the Cu wire 37b configuring the upper wiring section by itself.

As a result, in the MRAM according to the modified example of the third embodiment, it is possible to increase the reliability of the upper wiring section without adverse effects on the properties of the magnetic film in the MTJ device MD1 in the same way as the first embodiment.

Further, in the MRAM according to the modified example of the third embodiment, the Cu wire 37b is covered with the clad layer 53b while the silicon nitride film 55 is interposed in between.

That is, in the modified example of the third embodiment, since the clad layer 53b is formed over the silicon nitride film 55 whereas the clad layer 53b is formed under the silicon nitride film 55 in the first embodiment, it is possible to reduce damages of plasma entering the MTJ device section, the Cu wire 37b, and others when the clad layer is formed by the sputtering method or when the clad layer is selectively removed by the dry etching method.

Further, in the modified example of the third embodiment, unlike the second embodiment, it is possible to reduce damages of plasma entering the MTJ device section, the Cu wire 37b, and others when the clad layer is formed by the sputtering method and also it is possible to reduce damages of plasma entering the MTJ device section, the Cu wire 37b, and others when the silicon nitride film 55 over the Cu wire 37b is selectively removed.

What is claimed is:

1. A semiconductor device comprising:
    a MTJ device formed above said MTJ device and electrically coupled to said MTJ device;
    an upper wiring formed above said MTJ device and electrically coupled to said MTJ device;
    a first silicon nitride film formed over said upper wiring; and
    a second silicon nitride film formed on said first silicon nitride film,
    wherein a density of said first silicon nitride film is different from the density of said second silicon nitride film each other.

2. A semiconductor device according to claim 1,
    wherein the density of said first silicon nitride film is lower than the density of said second silicon nitride film.

3. A semiconductor device according to claim 1,
    wherein said first silicon nitride film imposes a tensile stress, and
    said second silicon nitride film imposes a compressive stress.

4. A semiconductor device according to claim 1, wherein said second silicon nitride film is larger than the thickness of said first silicon nitride film.

5. A semiconductor device according to claim 1,
    further comprising a clad layer formed between said upper wiring and said first silicon nitride film.

6. A semiconductor device according to claim 1, further comprising a clad layer formed over said second silicon nitride film.

7. A semiconductor device according to claim 1,
    further comprising an interlayer insulating film, formed so as to cover said MTJ device,
    wherein said interlayer insulating film has a first insulating region including the whole MTJ device section and a second insulating region formed over said first insulating region,
    said upper wiring includes:
        a main wiring portion formed so as to be selectively embedded into said second insulating region and electrically coupled to said MTJ device section; and
        a clad layer formed over said main wiring portion and said first silicon nitride film is formed over said second insulating region.

* * * * *